United States Patent
Nakayama

(10) Patent No.: US 6,408,102 B1
(45) Date of Patent: Jun. 18, 2002

(54) ENCODING/DECODING DEVICE

(75) Inventor: Tadayoshi Nakayama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/149,274

(22) Filed: Sep. 9, 1998

Related U.S. Application Data

(62) Division of application No. 08/985,316, filed on Dec. 4, 1997, now Pat. No. 5,841,381, which is a continuation of application No. 08/358,879, filed on Dec. 19, 1994, now abandoned.

(30) Foreign Application Priority Data

Dec. 20, 1993 (JP) ............................... 5-319989

(51) Int. Cl.[7] ............................... G06K 9/46
(52) U.S. Cl. ...................... 382/246; 382/233
(58) Field of Search .................. 382/244, 245, 382/246, 247, 248, 249, 250, 251, 252, 253; 348/402, 403, 404, 405, 406, 407; 358/425, 426, 427, 428; 341/106, 107, 64, 65; 340/171, 172

(56) References Cited

U.S. PATENT DOCUMENTS

| | | | | |
|---|---|---|---|---|
| 3,701,111 A | * | 10/1972 | Cocke et al. | 340/172 |
| 4,475,174 A | | 10/1984 | Kanayama | 364/900 |
| 4,516,246 A | | 5/1985 | Kenemuth | 341/67 |
| 4,700,175 A | | 10/1987 | Bledsoe | 341/65 |
| 4,899,149 A | | 2/1990 | Kahan | 341/67 |
| 5,377,266 A | * | 12/1994 | Katta et al. | 380/20 |
| 5,761,345 A | * | 6/1998 | Saito et al. | 382/246 |
| 5,801,840 A | * | 9/1998 | Sakai | 358/427 |
| 5,844,611 A | * | 12/1998 | Hamano et al. | 348/403 |

FOREIGN PATENT DOCUMENTS

| | | |
|---|---|---|
| JP | 57-055668 | 4/1983 |

* cited by examiner

Primary Examiner—Phuoc Tran
Assistant Examiner—Amir Alavi
(74) Attorney, Agent, or Firm—Fitzpatrick, Cella, Harper & Scinto

(57) ABSTRACT

A decoding device for Huffman codes, provided with an operation circuit for determining, from a Huffman code to be decode, the code length of the Huffman code and a predetermined code number thereof by calculation, and a conversion circuit for converting the code number into a fixed-length code prior to encoding.

27 Claims, 34 Drawing Sheets

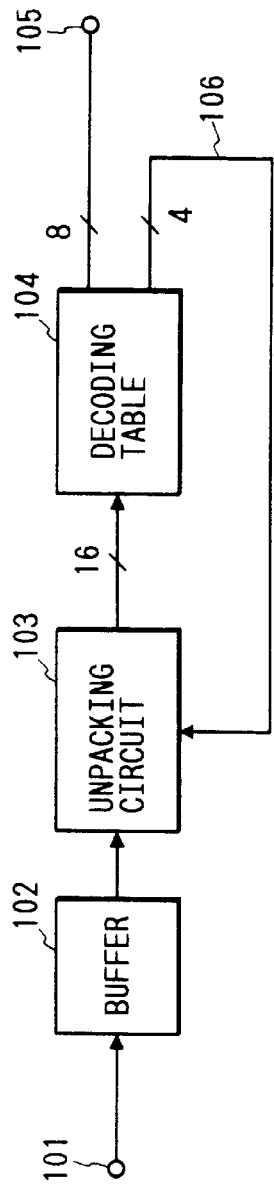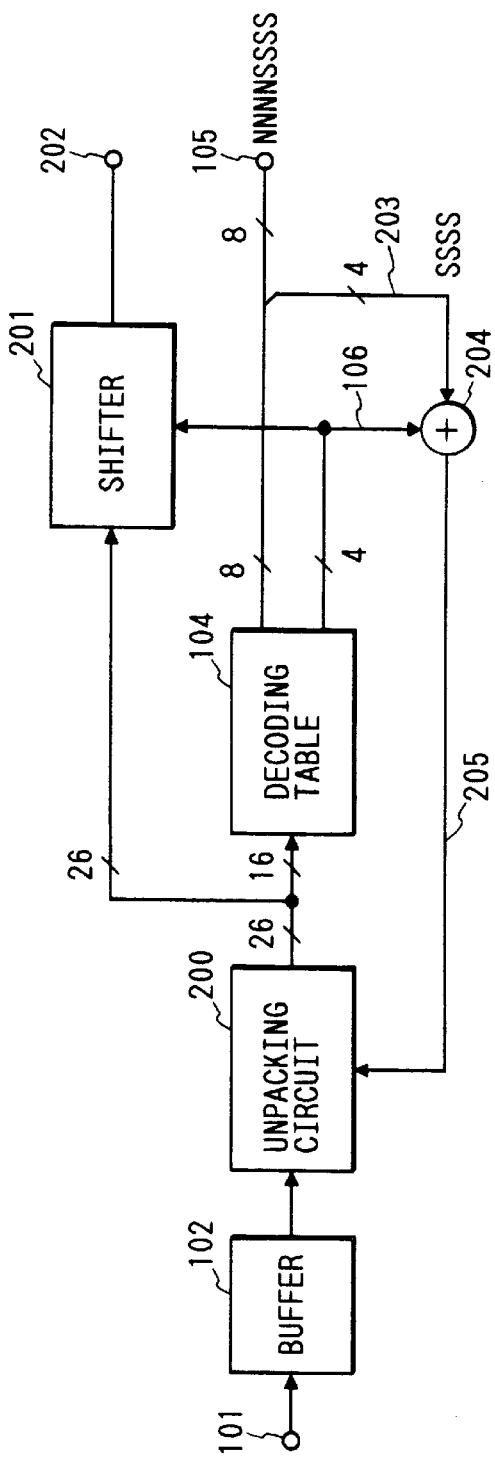

| CODE NUMBER | HUFFMAN CODE | CODE LENGTH |
|---|---|---|
| 0 | 0 | 1 |
| 1 | 100 | 3 |
| 2 | 101 | 3 |
| 3 | 1100 | 4 |
| 4 | 1101 | 4 |
| 5 | 1110 | 4 |
| 6 | 11110 | 5 |
| 7 | 111110 | 6 |
| 8 | 111111 | 6 |

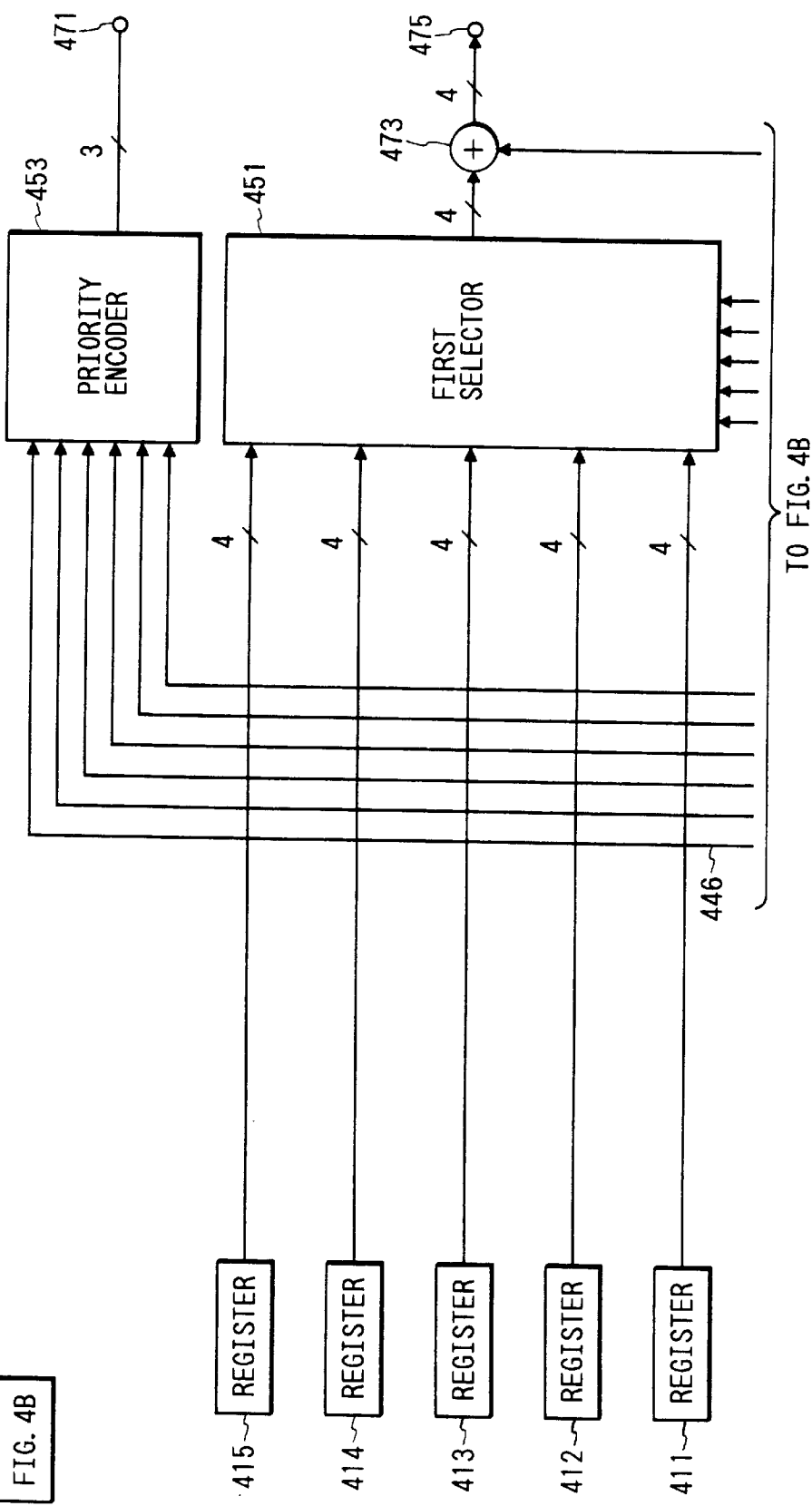

| i | LOWER LIMIT BOUNDARY VALUE OF i-BIT LENGTH CODE (6 BITS) | CORRESPONDING HUFFMAN CODE | CODE NUMBER |
|---|---|---|---|
| 1 | 000000 | 0 | 0 |
| 2 | 100000 | 100 | 1 |
| 3 | 100000 | 100 | 1 |
| 4 | 110000 | 1100 | 3 |
| 5 | 111100 | 11110 | 6 |
| 6 | 111110 | 111110 | 7 |

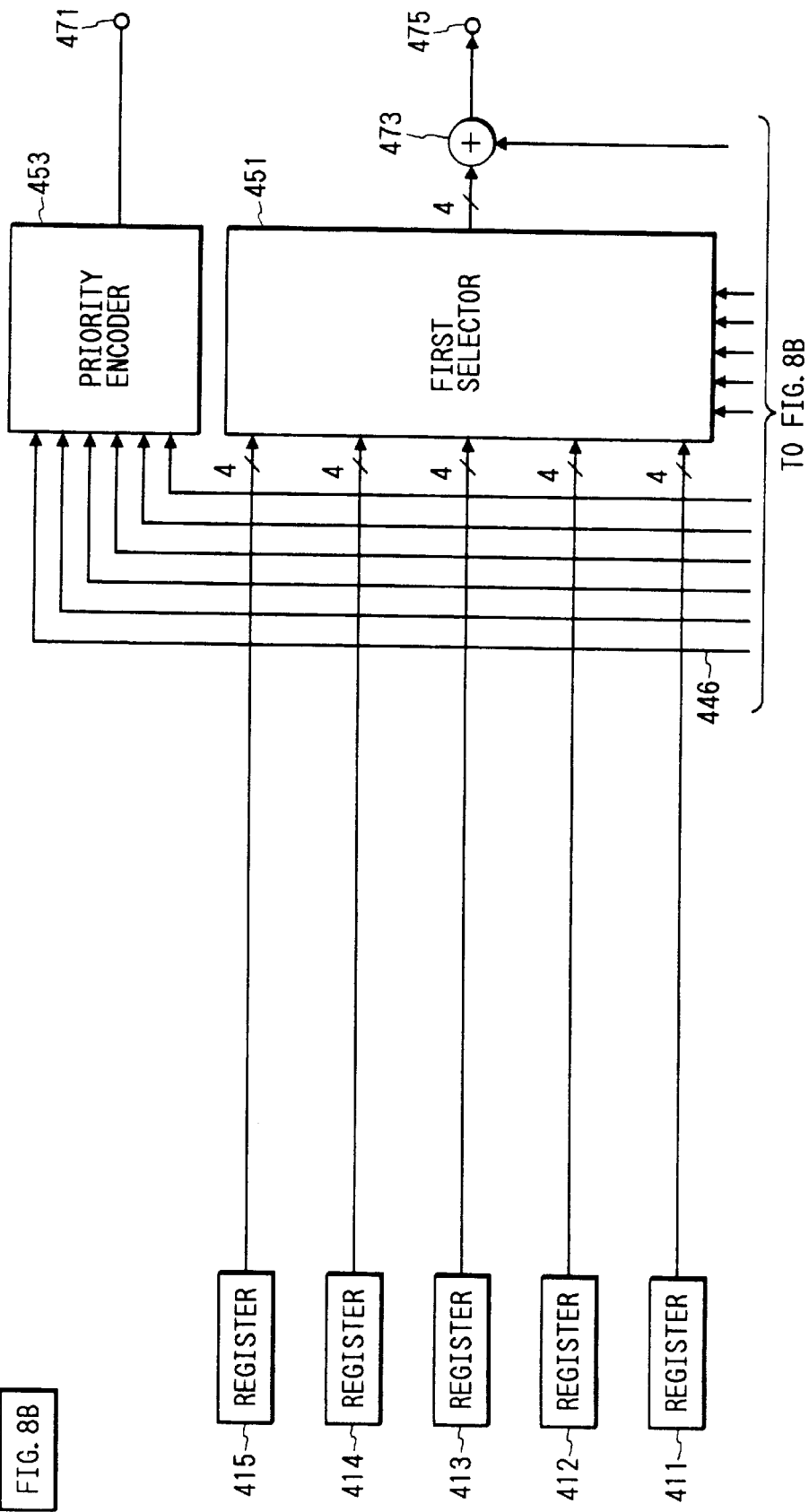

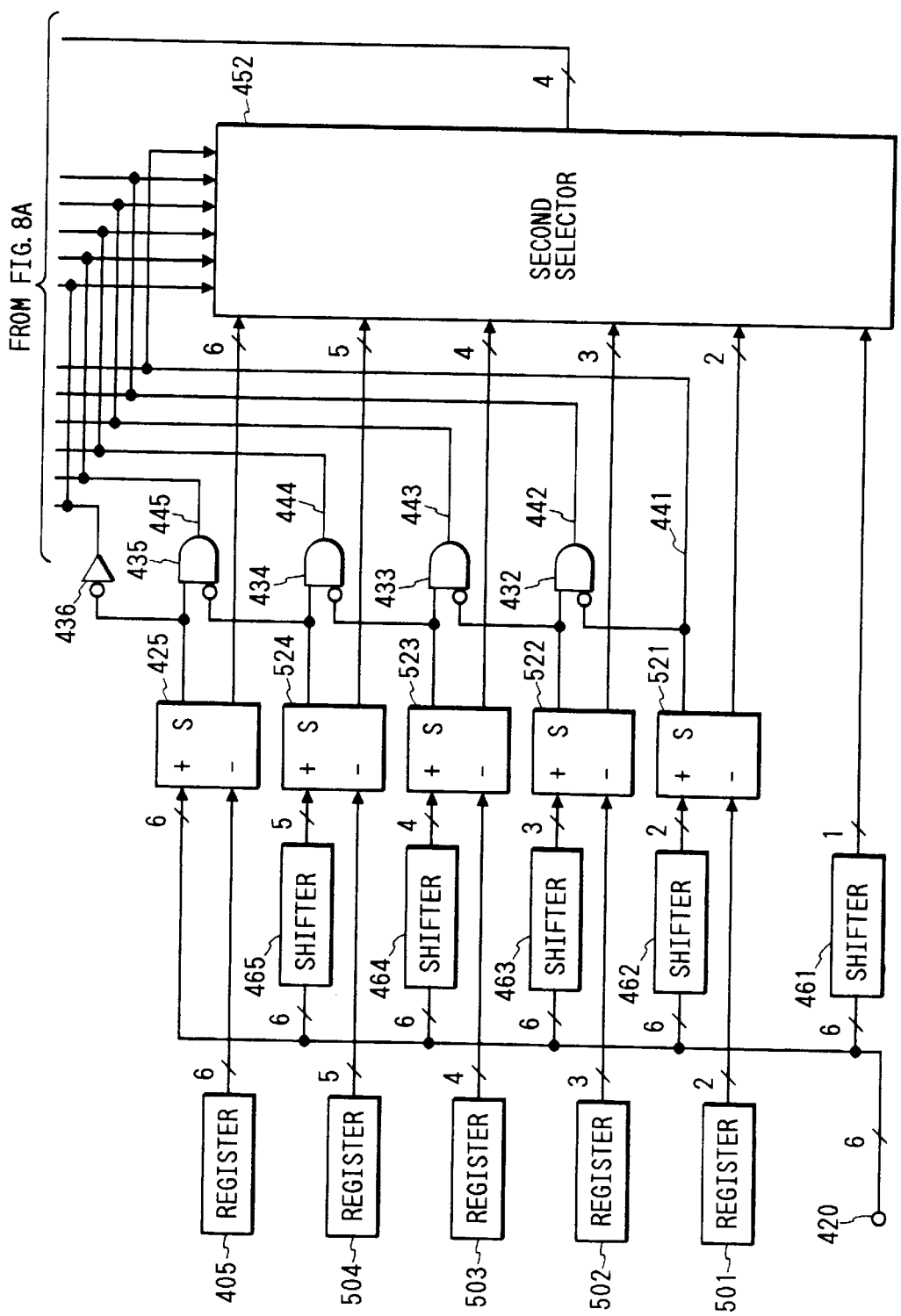

FIG. 9

| i | LOWER LIMIT BOUNDARY VALUE OF i-BIT LENGTH CODE (i BITS) |
|---|---|
| 1 | 0 |
| 2 | 10 |
| 3 | 100 |
| 4 | 1100 |
| 5 | 11110 |
| 6 | 111110 |

FIG. 11

| CODE NUMBER | HUFFMAN CODE | CODE LENGTH |
|---|---|---|
| 0 | 0 | 1 |
| 1 | 100 | 3 |
| 2 | 101 | 3 |
| 3 | 1100 | 4 |
| 4 | 1101 | 4 |
| 5 | 11100 | 5 |
| 6 | 11101 | 5 |
| 7 | 11110 | 5 |
| 8 | 11111 | 5 |

FIG. 12

| i | LOWER LIMIT BOUNDARY VALUE OF i-BIT LENGTH CODE (6 BITS) |
|---|---|
| 1 | 000000 |
| 2 | 100000 |
| 3 | 100000 |
| 4 | 110000 |
| 5 | 111000 |
| 6 | (1) 000000 |

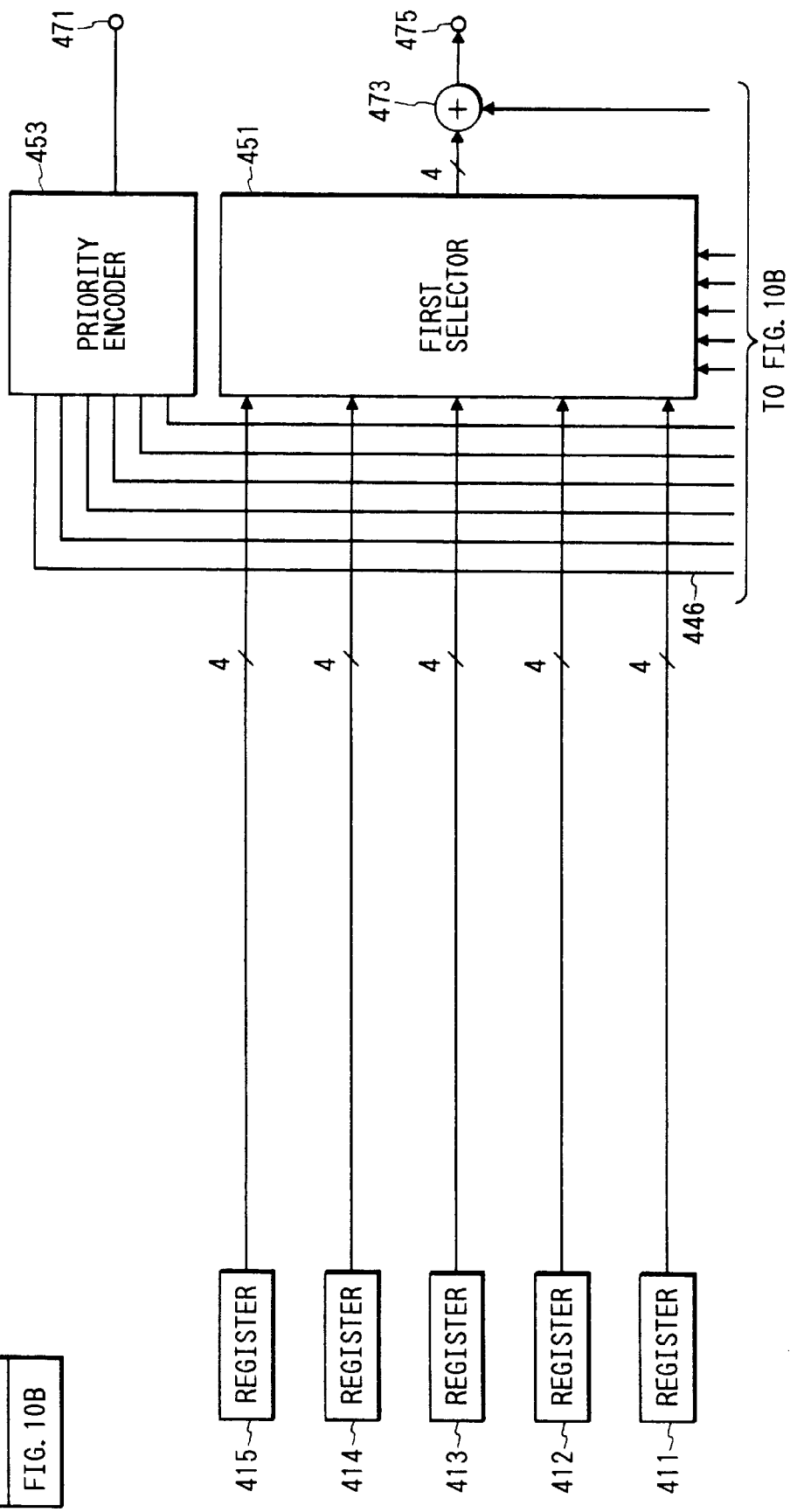

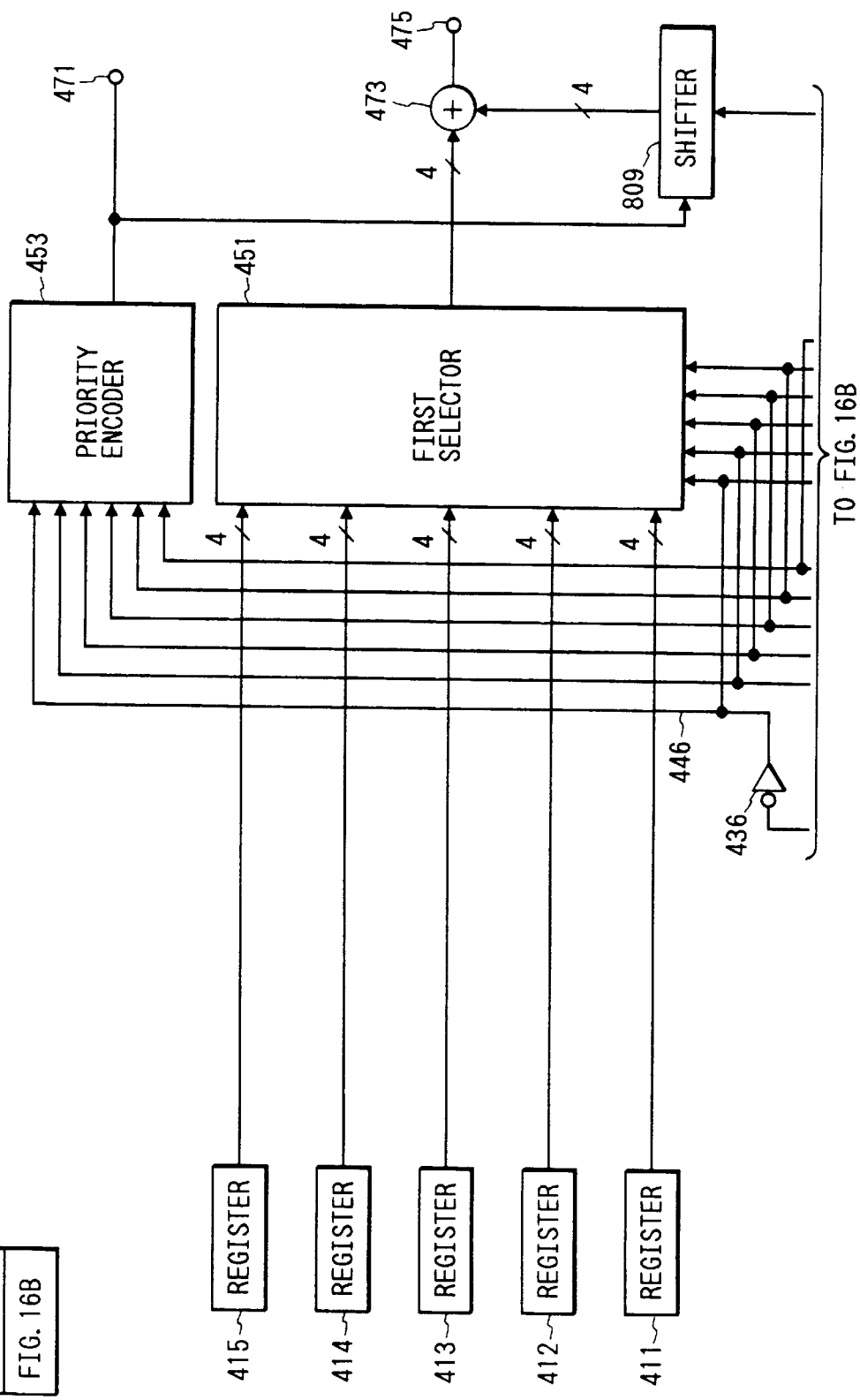

FIG. 20A

| FIG. 20 |
|---|
| FIG. 20A |
| FIG. 20B |

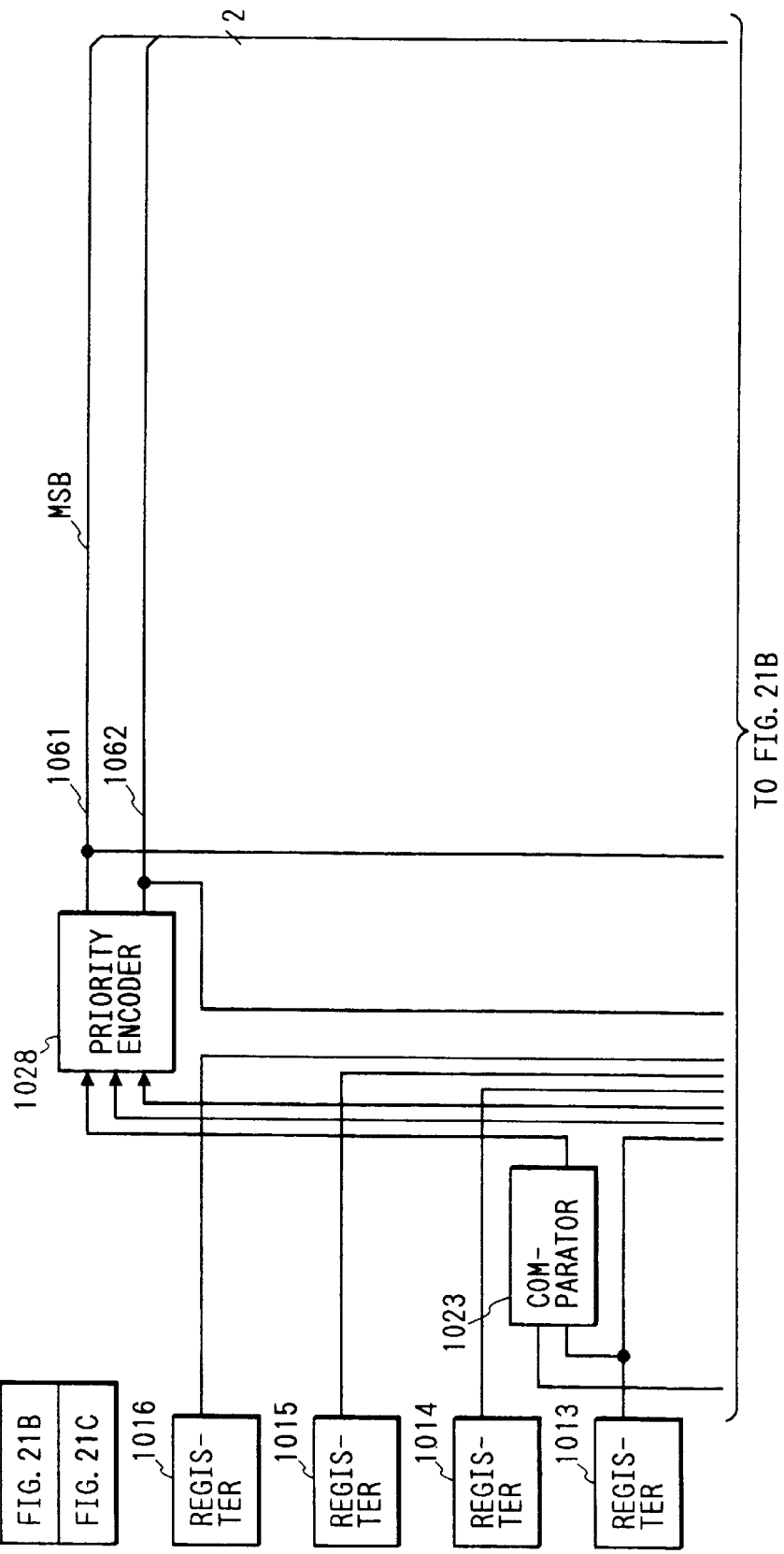

| FIG. 24A |
| FIG. 24B |

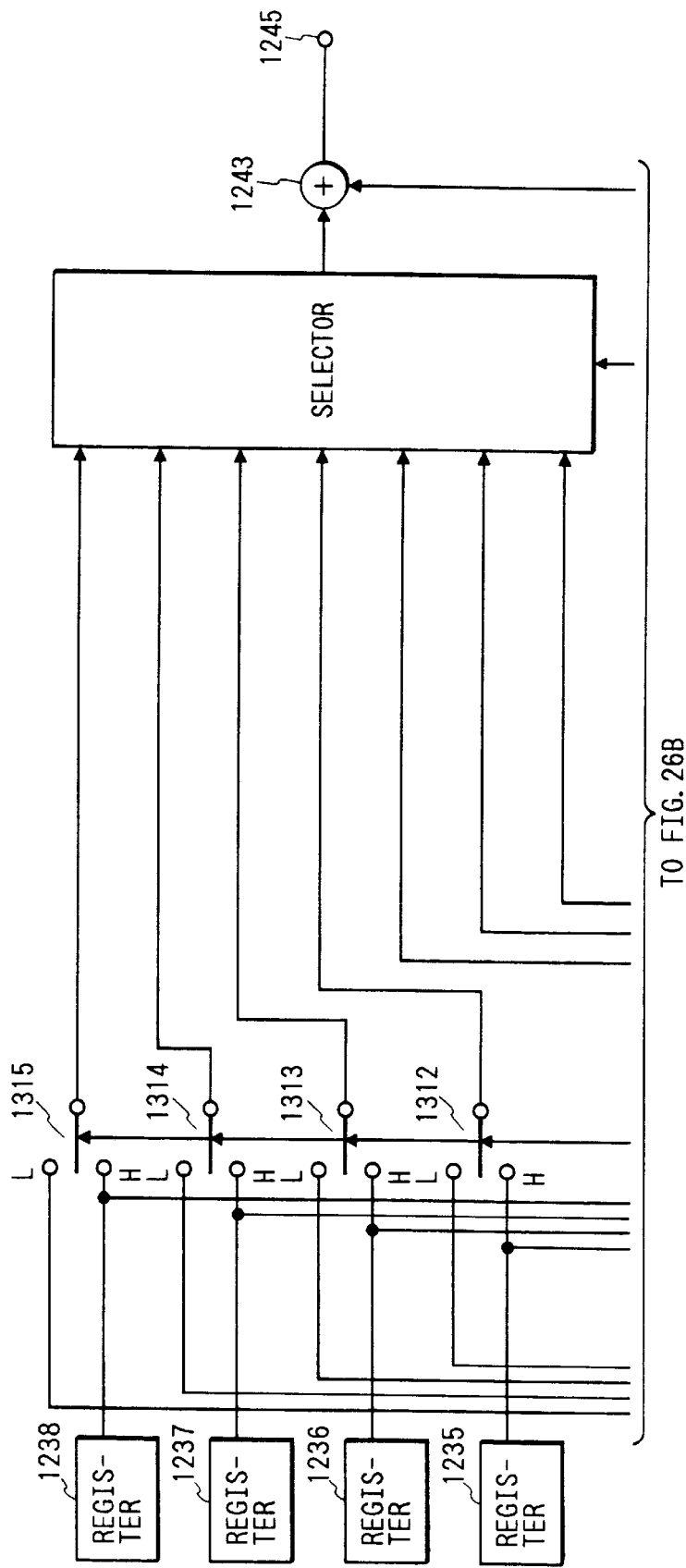

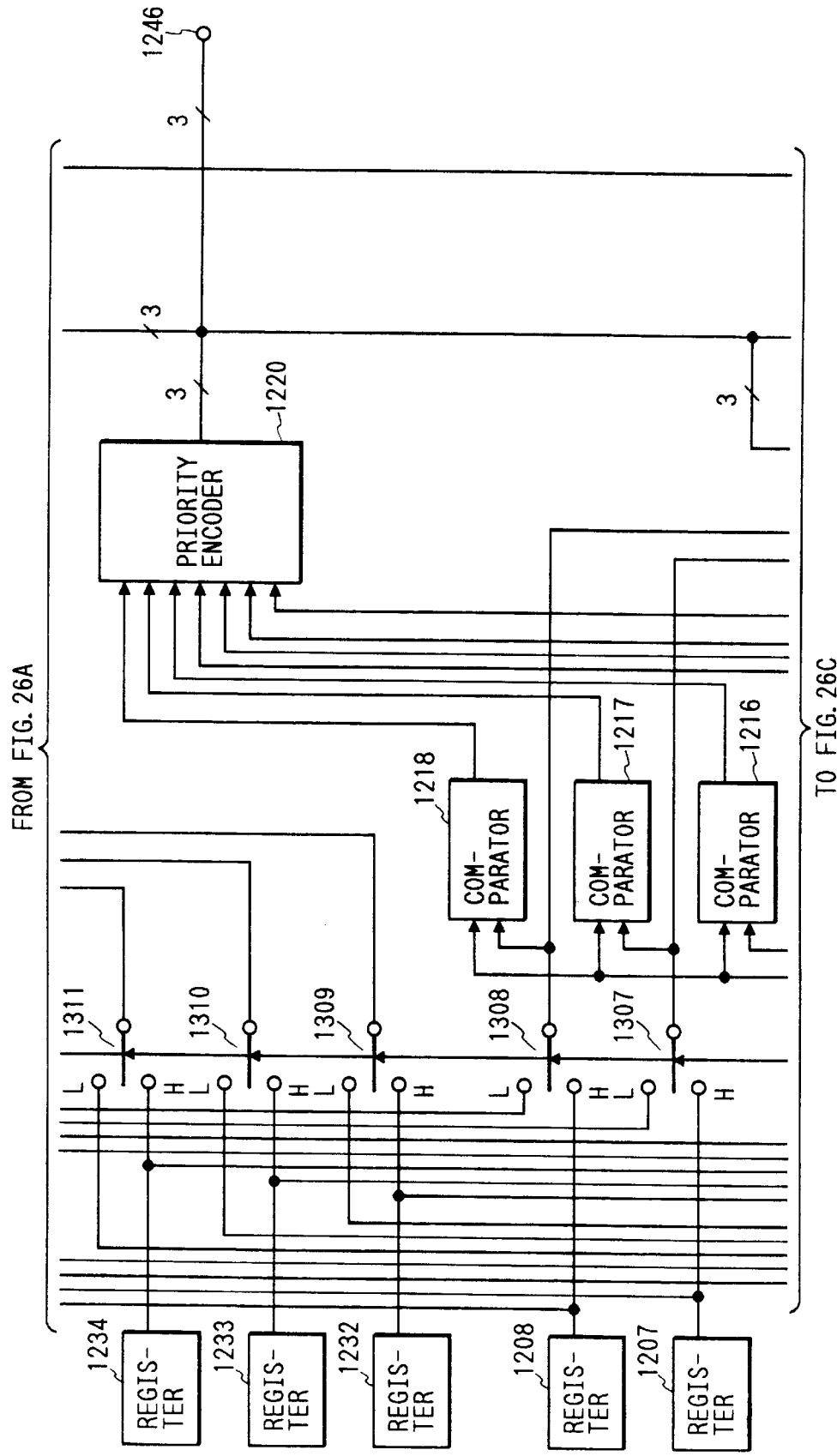

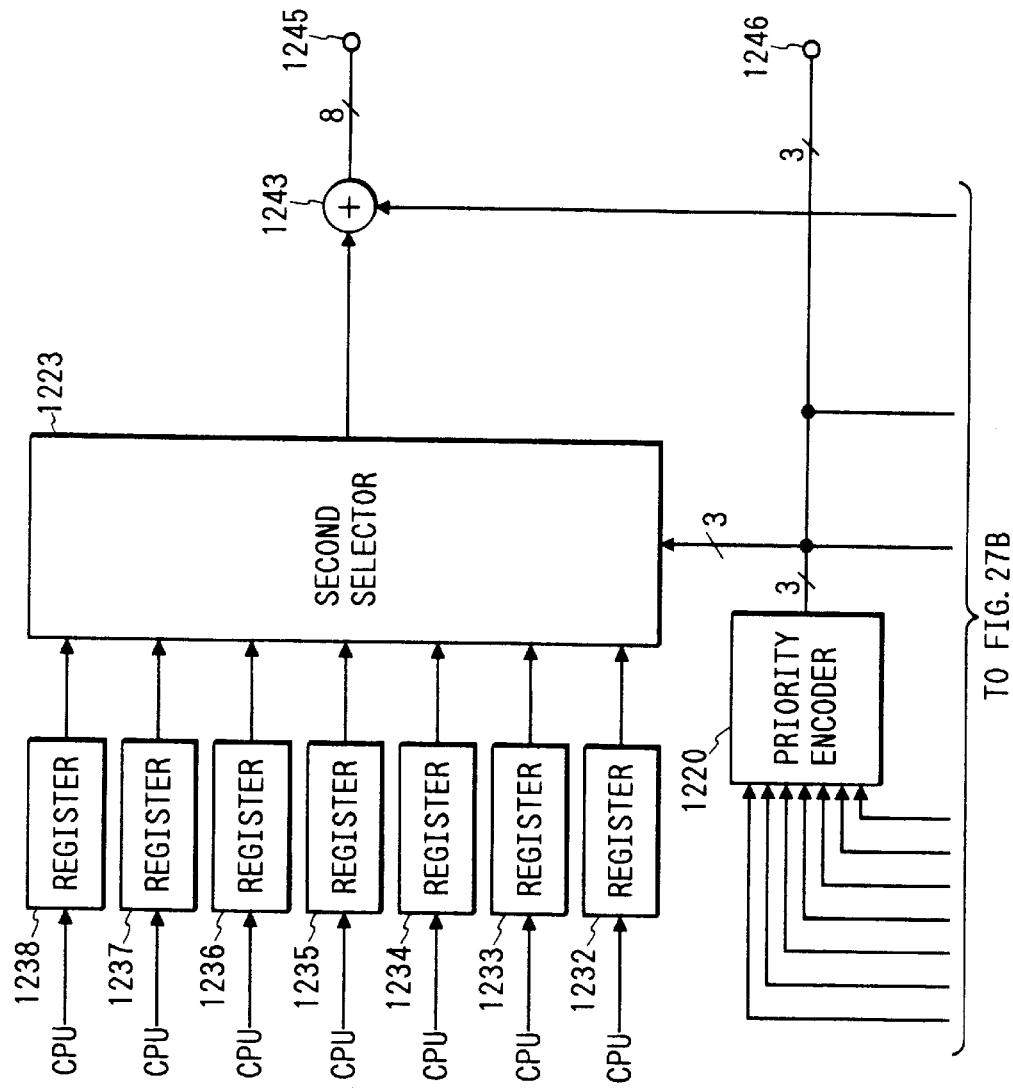

ENCODING/DECODING DEVICE

Division of Ser. No. 08/985,316 filed on Dec. 4, 1997, now U.S. Pat. No. 5,841,381 which is a continuation of Ser. No. 08/358,879 filed on Dec. 12, 1994, now abandoned.

BACKGROUND OF THE INVENTION

1. Field of the Invention

The present invention relates to a device for encoding and/or decoding of a Huffman code which is a variable-length code.

2. Related Background Art

Compression technologies for the digital signals are showing remarkable progresses in recent years, and methods proposed by JPEG (Joint Photographic Exterts Group) and MPEG (Moving Picture Exterts Group) are becoming accepted as world-wide standards for compressing digitized still and moving image signals.

In these compressing methods, the image signal is at first orthogonally transformed by DCT (discrete cosine transformation), then the amount of information is reduced by eliminating the signal components of the visually inconspicuous portions in thus transformed signal, and the information is further compressed by Huffman encoding.

In the Huffman encoding, the codes of variable length are assigned according to the frequency of appearance of the codes. The amount of information can be compressed by the assignment of a code of a shorter bit length to the code of a higher frequency of appearance.

In the decoding of thus encoded Huffman codes with a table, the memory capacity required for the table inversely proportional to the speed of decoding. Consequently there can be conceived two opposite approaches which are:

a) a method of reducing the memory capacity for the table, though the process speed is low; and b) a method of increasing the process speed though a larger memory capacity is required for the table.

An extreme case of the method (a) consists of decoding of 1 bit in each cycle, requiring several cycles for decoding a Huffman code. Such decoding method is cited as a conventional method in the Japanese Patent Laid-open Application No. 57-55668. On the other hand, an extreme case of the method (b) decodes a Huffman code in a cycle.

There can naturally be conceived other intermediate methods between these extreme cases, such as methods for decoding two or more bits in a cycle.

In all these conventional methods, the information of the Huffman code to be decoded is supplied, without conversion to another information, either directly into the table or a part of such information is supplied, in combination with information obtained by previous decoding, into the table.

FIG. 1 shows a conventional decoding device for decoding a Huffman code in a cycle, designed for decoding a Huffman code of a maximum code length of 16 bits into a fixed-length code of 8 bits.

In FIG. 1, there are shown a terminal 101 for entering the Huffman-encoded data, and a buffer 102 for temporarily storing the data. Since Huffman code is a variable-length code, the input data rate cannot be constant if the output data rate at the decoding is maintained constant, so that the above-mentioned buffer is required.

There are also provided an unpacking circuit 103 for connecting the data entered with a unit of m bits and obtaining the leading 16 bits after the removal of the already decoded data; a decoding table 104 for decoding a Huffman code in said 16-bits data; a terminal 105 for outputting the decoded fixed-length code (8 bits); and a 4-bits signal 106 indicating the bit length of the decoded Huffman code.

Said 4-bits signal 106 may represent the bit length itself or the bit length minus one, and FIG. 1 shows the latter case. A maximum code length of 16 bits requires 5 bits for direct representation, but, as a code length of 0 bit does not exist, a representation with 4 bits is made possible by indicating (code length −1), namely by representing the code length of 1 bit with "0000". However, there is no difference between the two methods if the maximum code length is not an exponent of 2. The signal 106 is supplied to the above-mentioned unpacking circuit 103, for eliminating the decoded data.

This example required the memory of a large capacity, as the decoding table 104 requires 64 k×12 bits or 96 kBytes.

Then, FIG. 2 shows the configuration in which the above-explained conventional example is applied to a decoding device for the JPEG codes. Also in case the JPEG codes, a Huffman code of a maximum code length of 16 bits is decoded into a fixed-length code of 8 bits (NNNN signal of 4 bits and SSSS signal of 4 bits), but additional bits are inserted between the Huffman codes and have to be removed at the decoding.

If the additional bits have a maximum bit length of 10 bits, the signal released from the unpacking circuit 200 shown in FIG. 2 becomes 26 bits. Among these 26 bits, the leading 16 bits are supplied to the decoding table 104 and are converted, as already explained with reference to FIG. 1, into a fixed-length code of 8 bits and code-length information 106 of 4 bits. On the other hand, the signal of 26 bits is also supplied to a shifter 201 for removal of the decoded Huffman code based on the code-length information (said removal being achieved by shifting said signal of 26 bits by said code length), and the leading 10 bits are supplied to a terminal 202. All said 10 bits do not constitute the signal of additional bits, but only the bits of an upper rank indicated by the SSSS signal output from the decoding table constitute said additional bits.

Thus, after the decoding of a Huffman code and before the decoding of a next Huffman code, it is required, in the configuration shown in FIG. 1, to remove the bits of the already decoded Huffman code by the unpacking circuit, but, in case of FIG. 2, to remove also the bits of the additional signal.

For this reason, the signal 106 indicating the code length of the Huffman code and a signal 203 (SSSS signal) indicating the bit length of the additional bits are added in an adder 204, and the result of the addition is supplied to the unpacking circuit 200 for removing the Huffman code and the additional bits in each cycle.

In the conventional example explained above, the high-speed decoding of the Huffman codes requires a large memory capacity for the decoding table, leading to the following drawbacks:

1) In forming the decoding device into an integrated circuit, the chip area becomes larger and requires a higher cost;

2) A long time is required for the rewriting of the decoding table; and

3) As the amount of information in the decoding table is large, it is not possible to effect optimum Huffman encoding for each information (for example image information) to be compressed. If such optimum encoding is conducted, the decreased information by compression has to be associated, for each image, with information on the decoding table, and such optimum encoding becomes meaningless because the amount of such associated information is quite large.

SUMMARY OF THE INVENTION

The object of the present invention is to reduce the memory capacity required for the decoding table, as such reduction of the memory capacity resolves all three drawbacks mentioned above.

The above-mentioned object can be attained, according to an embodiment of the present invention, by a Huffman encode/decoding device comprising means for comparing a Huffman code to be decoded with plural boundary values; means for identifying the bit length of said Huffman code from the result of comparison by the comparing means; means for determining the difference between the lower limit boundary value at the bit length and said Huffman code; and means for adding the difference to a code number corresponding to the boundary value, wherein the code number of said Huffman code is determined by calculation with the above-mentioned means, and the Huffman code is with a table for converting the code number to the original fixed-length code.

BRIEF DESCRIPTION OF THE DRAWINGS

FIG. 1 is a block diagram of a conventional Huffman code decoding device;

FIG. 2 is a block diagram of a conventional decoding device for the JPEG code;

FIGS. 4A and 4B, when combined as shown in FIG. 4, show a circuit diagram of a first embodiment of the present invention;

FIGS. 8A and 8B, when combined as shown in FIG. 8, show a circuit diagram of a second embodiment of the present invention;

FIG. 9 is a table showing correspondence between value i and lower limit boundary value for i-bit codes;

FIGS. 10A and 10B, when combined as shown in FIG. 10, show a circuit diagram showing a third embodiment of the present invention;

FIG. 11 is a table showing another Huffman code system;

FIG. 12 is a table showing correspondence between value i and lower limit boundary values of i-bit codes, in the Huffman code system shown in FIG. 11;

FIGS. 16A and 16B, when combined as shown in FIG. 16, show a circuit diagram of a fifth embodiment of the present invention;

FIGS. 20A and 20B, when combined as shown in FIG. 20, show a circuit diagram of a ninth embodiment of the present invention;

FIGS. 21A, 21B and 21C, when combined as shown in FIG. 21, show a circuit diagram of a tenth embodiment of the present invention;

FIGS. 26A, 26B and 26C, when combined as shown in FIG. 26, show a circuit diagram of a fourteenth embodiment of the present invention;

FIGS. 27A and 27B, when combined as shown in FIG. 27, show a circuit diagram of a fifteenth embodiment of the present invention;

DETAILED DESCRIPTION OF THE PREFERRED EMBODIMENTS

Figures 3, 5:
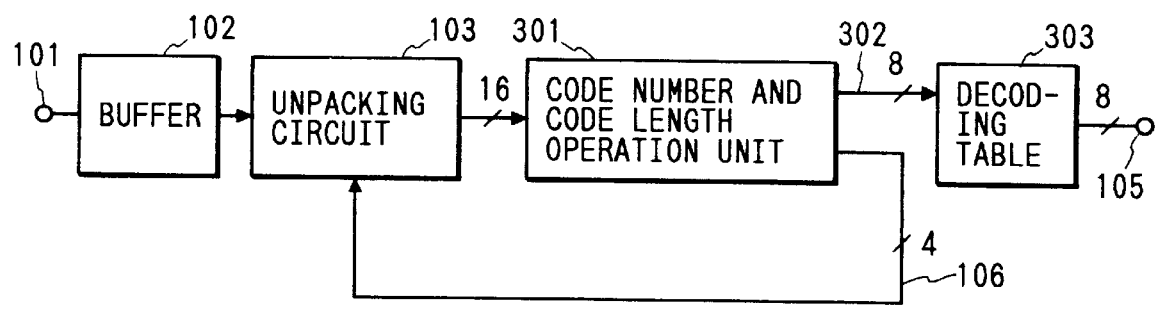
FIG. 3 is a block diagram of a decoding device of the present invention, for Huffman code.
FIG. 5 is a table showing correspondence between code numbers and Huffman codes.
Figure 4B:
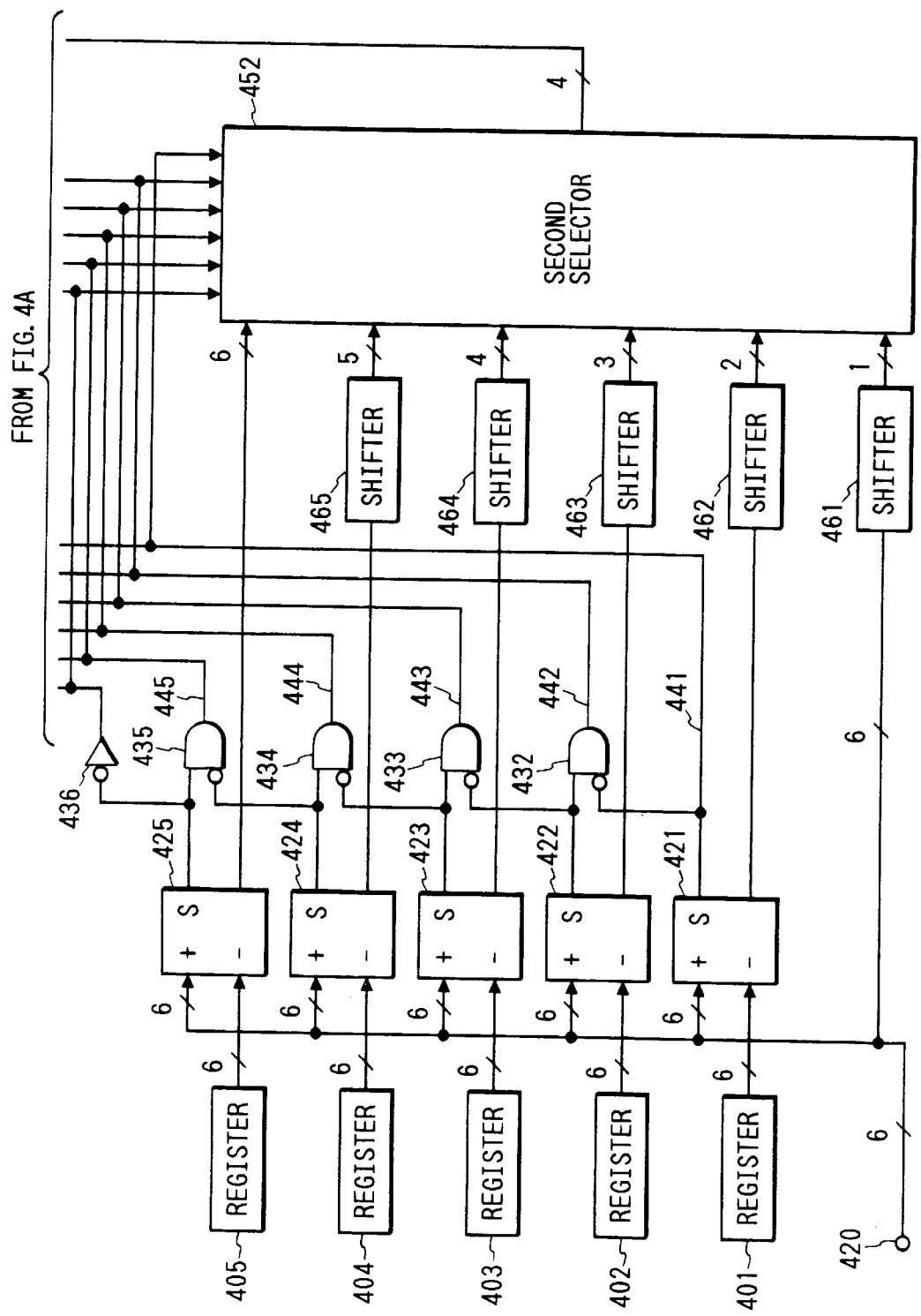

FIGS. 3 to 4B illustrate a 1st embodiment of the present invention.

The content of the present invention can be briefly described as follows.

The code length and the code number of the Huffman code to be decoded are determined by calculation and logic circuits, and the code number is converted in a decoding table to the original fixed-length code. In this manner the memory capacity required for said decoding table can be significantly reduced.

In the following there will be given an explanation on the code numbers. In assigning the Huffman codes to the fixed-length codes, said fixed-length codes are arranged in the descending order of the probability of appearance, and the sequential numbers assigned to the order of arrangement are called code numbers.

Consequently the minimum necessary number of bits required for representing the code number does not exceed the number of bits of the fixed-length code. (Both bit numbers are usually same, and are assumed to be same also in the present embodiment.)

FIG. 3 shows the configuration of a Huffman code decoding device, in which the present invention is applied.

The method of determination of the code number and the code length by the operational and logic circuits in the configuration shown in FIG. 3, will be explained later with reference to FIGS. 4A and 4B. For the purpose of comparison with the conventional example shown in FIG. 1, the numbers of bits for example in the Huffman code length are taken same as in the conventional example. In FIG. 3, numbers 101–103, 105 and 106 have the same meaning as in the conventional example. Also there are shown an operation unit 301 for receiving a Huffman code and determining the code number and the code length thereof; an 8-bit signal 302 representing the code number; and a decoding table 303 for converting the 8-bit code number into an 8-bit fixed-length code.

As will be apparent from FIG. 3, by determining the code number from the Huffman code by calculation in the operation unit 301, the decoding table 303 has 8 bits for the input and for the output. Consequently the memory capacity required for the table 303 becomes 256 bytes, corresponding to 1/384 of the capacity in the conventional example.

In the following there will be explained, with reference to FIGS. 4A to 7, the operation unit 301 for determining the code number and the code length from the Huffman code by calculation. However, for the purpose of simplicity, there will be explained a small-sized circuit for determining a 4-bits code number and a 3-bit code length, from 9 Huffman code of 6 bits at maximum.

FIG. 5 shows the correspondence between the Huffman codes and the code numbers.

Figures 6, 7:
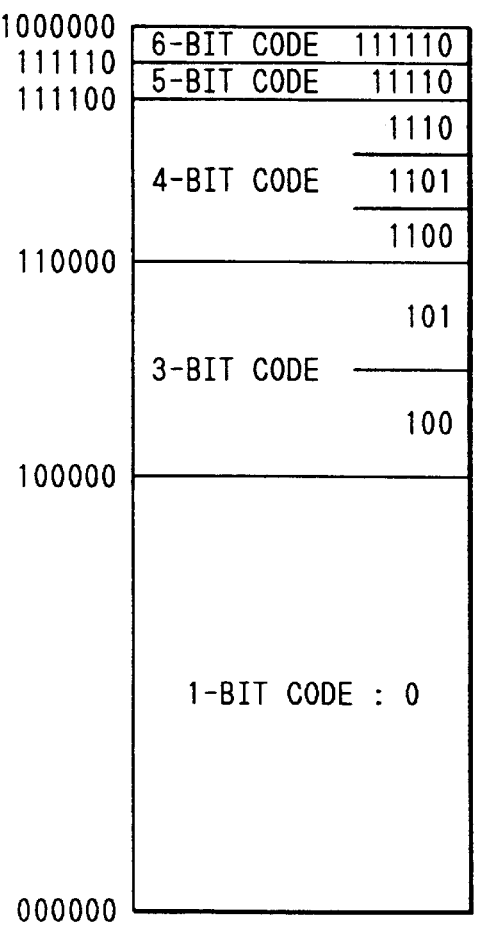
FIG. 6 is a table showing correspondence among lower limit boundary values of i-bit codes, Huffman codes and code numbers for i=1, 2, 3, 4, 5 and 6.
FIG. 7 is a view Huffman codes along a numerical line [000000$_2$, 1000000$_2$]

Also FIG. 6 shows the correspondence among the lower limit boundary values of i-bit codes, the Huffman codes and the code numbers for i=1, 2, 3, 4, 5 and 6.

The lower limit boundary value for i-bit codes shown in FIG. 6 means the boundary value (6 bits) between the codes of i bits and those less than i bits, when the Huffman codes are arranged along the numerical line of [$000000_2$, $1000000_2$] according to the following rules:

Rule (1): Codes are arranged in the increasing order of the code length, from the side of $000000_2$. (Codes of a same code length are arranged in the increasing order of value.)

Rule (2): A code of i bits occupies an area of $1/2^i$ on the numerical line. (Two codes of i bits occupies an area of $2 \times 1/2^i$.)

FIG. 7 shows the areas occupied by the codes of different code lengths, when the Huffman codes shown in FIG. 5 are arranged according to the above-explained rules (1) and (2). The above-mentioned boundary value can be easily read from FIG. 7.

Now referring to FIGS. 4A and 4B, registers 401–405 are provided for respectively retaining the lower boundary values of the codes of 2 to 6 bits. The lower boundary limit value for the 1-bit code need not be retained, as it is always $000000_2$ in any code system.

There are also provided registers 411–415 for retaining the code numbers of Huffman codes corresponding to the lower limit boundary values (stated differently positioned immediately above the boundary values shown in FIG. 7); a terminal 420 for entering 6-bit data containing at least a Huffman code; and subtractors 421–425 for respectively subtracting, from the 6-bit input data entered from the terminal 420, the five boundary values retained in the registers 401–405. The subtractors 421–425 serve to compare the Huffman code with plural boundary values and to obtain the differences therebetween.

The results of comparison can be identified by sign bits output from said five subtractors 421–425. Each of the subtractors effects a subtraction "(input data)−(boundary value)", and a sign bit "0" indicates that the result of subtraction is 0 or larger, namely input data≧boundary value. The code length of the Huffman code entered into the terminal 420 can be identified by the presence of a signal "1", among the signals 442–446 output from a 1-bit inverter 436 and AND gates 432–435 with negative logic inputs, and a signal 441 from the subtractor 421. More specifically, if the signal 441 is "1", the input signal is smaller than the lower limit boundary value of the 2-bit codes, so that the Huffman code has a code length of 1 bit. Also if the signal 442 is "1", the input signal is at least equal to said lower limit boundary value of the 2-bit codes but smaller than the lower limit boundary value of the 3-bit codes, so that the Huffman code has a code length of 2 bits. The code length can be similarly identified also for other signals 443–446.

These signals 441–446 are supplied to a 1st selector 451, a 2nd selector 452 and a priority encoder 453. The priority encoder 453 encodes the entered 6-bit result of the identification into a 3-bit binary code length signal which is output from a terminal 471.

The 1st selector 451 receives the above-mentioned code numbers from the five registers 411–415, and the above-mentioned signals 442–446 as selection control signals. For example, if the selection control signal 442 is "1" among the signals 442–446, the 1st selector 451 selects and output the code number supplied from the register 411.

Other signals 443, 444, 445, 446 respectively select the code numbers entered from the registers 412, 413, 414, 415. The code number selected in said 1st selector 451 is supplied to an adder 473.

The 2nd selector 452 receives all the above-mentioned six signals 441–446 as the selection control signals, and following six data as the signals to be selected:

1st data: 1-bit data obtained by shifting the 6-bit data, entered from the terminal 420, to the right by 5 bits in a shifter 461;

2nd data: 2-bit data obtained by shifting the output of the subtractor 421 to the right by 4 bits in a shifter 462;

3rd data: 3-bit data obtained by shifting the output of the subtractor 422 to the right by 3 bits in a shifter 463;

4th data: 4-bit data obtained by shifting the output of the subtractor 423 to the right by 2 bits in a shifter 464;

5th data: 5-bit data obtained by shifting the output of the subtractor 424 to the right by 1 bit in a shifter 424; and 6th data: 6-bit data output from the subtractor 425.

According to said six control signals 441–446, the 2nd selector 452 selects and sends one of the above-mentioned six data to an adder 473. The signal output from the 2nd selector 452 represents a normalized difference, obtained by subtracting the lower limit boundary value, corresponding to the code length of the Huffman code entered into the terminal 420 and subjected to decoding, from the Huffman code.

For example, when the control signal 441 is "1", the above-mentioned 1st data (1 bit) from the shifter 461 are selected and output as the least significant bit (hereinafter represented as LSB) of the 2nd selector. When the control signal 446 is "1", the above-mentioned 6th data (6 bits) from the subtractor 425 are selected, and the LSB of the 6-bit data is output as the LSB of the 4-bit output from the 2nd selector 452. The output signal of the 2nd selector 452 is used for calculating the code number. As the code numbers are limited to a range of 4 bits, the output signals of the selector 452 can also be limited to 4 bits. Consequently, within the above-mentioned 6-bit data, the 2 uppermost bits are disregarded and the lower 4 bits are output from the selector 452.

The signal output from the selector 452 is added, in an adder 473, to the output signal of the 1st selector 451, whereby the desired code number is determined by calculation and output to a terminal 475.

In the following there will be explained the function of the circuit shown in FIG. 4, with an example of specific data.

It is now assumed that 6-bit data "111010" are entered into the terminal 420.

The 6-bit data are compared in the comparators 421–425, with all the lower limit boundary values of the 2- to 6-bit codes, retained in the registers 401–405, but, in the comparisons with the 6-bit input data "111010", particularly meaningful are those with the lower limit boundary value "110000" of the 4-bit codes retained in the register 403 and with the lower limit boundary value "111100" of the 5-bit codes retained in the register 404. Since the 6-bit input data satisfy a relationship 110000≦111010 (input data)<111100 with respect to the above-mentioned lower limit boundary values, the subtractors 423, 424 respectively release sign bits "0" and "1", so that the signal line 444 alone assumes a value "1" among those 441–446. On the other hand, the subtractor 423 outputs 6-bit data 0010 (=111010−110000) which are converted into 4-bit data "0010" by a 2-bit shift to the right in the shifter 464 and supplied to the 2nd selector 452. The 4-bit data from the shifter 464 are selected in the 2nd selector 452, by the signal line 444 (="1"), and supplied to the adder 473. Also in the 1st selector 451, the code number 3 (=$0011_2$) from the register 413 is selected by the signal line 444, and a corresponding 4-bit signal "0011" is supplied to the adder 473.

The adder 473 adds the two input 4-bit signals 0011 and 0010, and sends the code number 0101 to the terminal 475. On the other hand, the signals on the lines 441–446 are supplied to and encoded in the priority encoder 453, whereby a 3-bit signal "100" is output, as the code length signal of the Huffman code, from the terminal 471.

In this manner the Huffman code contained in the 6-bit input data "111010" entered into the terminal 420 is identified to have a code length=4 and a code number=5. The code length and the code number for other Huffman codes can be determined by similar calculations.

FIGS. 8A and 8B illustrate a 2nd embodiment of the present invention, particularly a portion of the operational unit 301 in FIG. 3 for determining the code number and the code length by calculation.

This embodiment is different from the foregoing 1st embodiment, basically in the position of the shifter 462–465. In the 1st embodiment shown in FIGS. 4A and 4B the shifters are positioned at the output side of the subtractors 421–424, but, in the present embodiment, the shifters are positions at the side of the (+) input terminals of the subtractors 521–524.

The above-mentioned difference provides, in comparison with the first embodiment, the following two differences:

(1) As the 6-bit data entered into the terminal 420 are shifted and reduced in the number of bits prior to the subtracting operation, the number of bits of the registers 501–504 for retaining the lower limit boundary values of i-bit codes (i=2, 3, 4, 5) can be respectively limited to 2, 3, 4 and 5 bits; and (2) Similarly the number of bits of the subtractors 521–524 for subtracting the lower limit boundary values from the 6-bit input data can be respectively reduced to 2, 3, 4 and 5 bits.

The registers and subtractors modified as explained above are distinguished by new numbers 501–504, 521–524, but other blocks are equivalent, in function, to those in the 1st embodiment (FIGS. 4A and 4B) and are therefore represented by same numbers. The present embodiment shown in FIGS. 8A and 8B is entirely equivalent to the 1st embodiment shown in FIGS. 4A and 4B, as the shift of the outputs of the subtractors is equivalent to the shift of the inputs thereof, and the shift of the outputs of the registers retaining the boundary values is equivalent to the shift, in advance, of the values retained in said registers.

Consequently the output of the operational circuit of the present embodiment is identical with that in the foregoing 1st embodiment. In the present embodiment, the registers 501–504, 405 respectively retain the lower limit boundary values of i-bit codes with i bits.

It is therefore rendered possible, as shown in FIG. 9, to represent the lower limit boundary value for the i-bit codes by i bits.

Figure 10B:
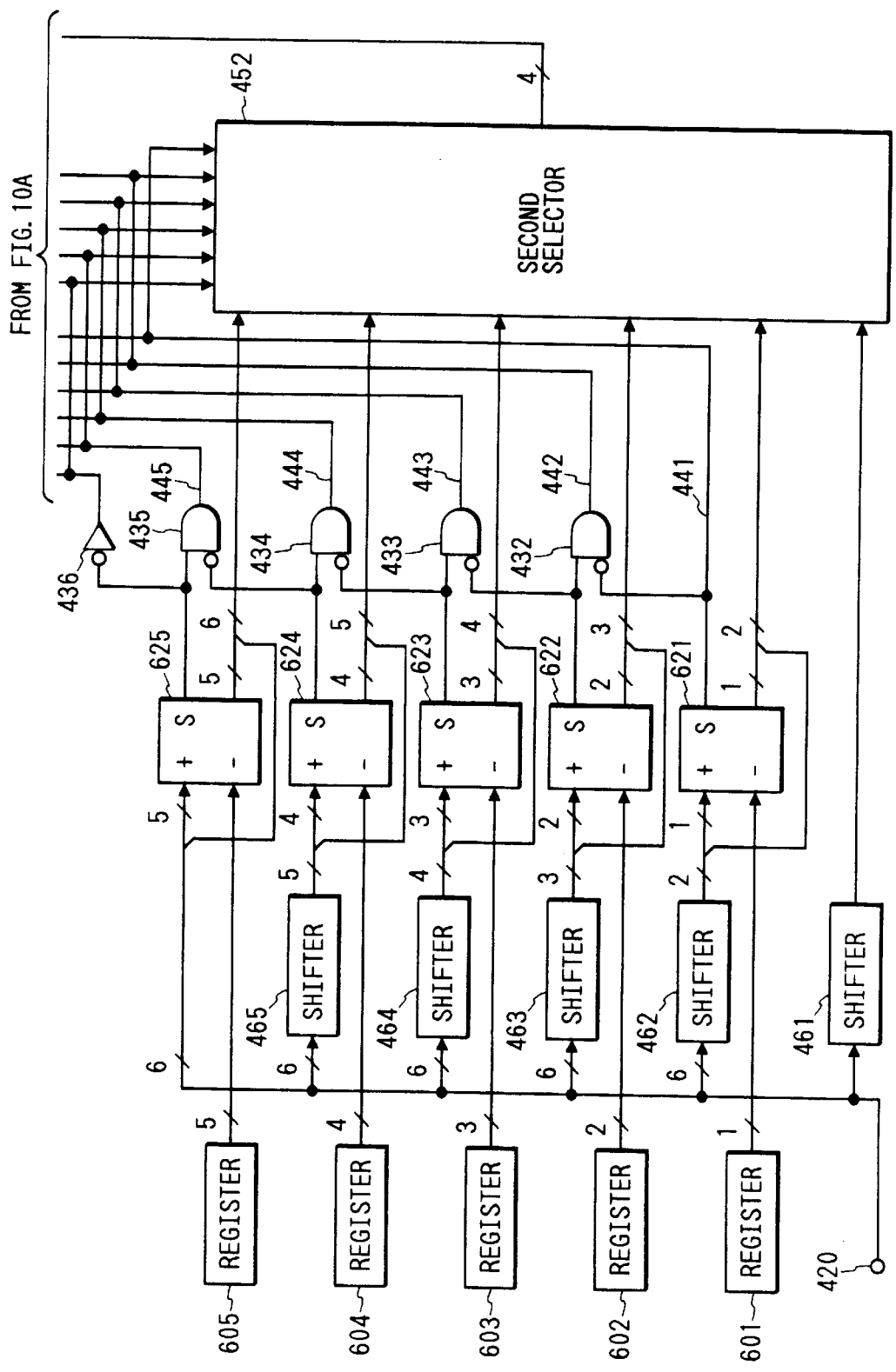

All the lower limit boundary values shown in FIG. 9 have a lowermost bit (LSB) "0", and such situation stands also for the ordinary Huffman codes. If the LSB is always "0", it is not necessary to retain such LSB nor to effect the subtraction in said bit. These points are realized in a third embodiment of the present invention, shown in FIG. 10.

This embodiment is different from the foregoing 2nd embodiment, shown in FIGS. 8A and 8B, in the following two points:

(1) Registers 601–605, for retaining the lower limit boundary values for the i-bit codes (i=2, 3, 4, 5, 6), are only required to retain the values without the LSB "0". The number of bits of the registers is further reduced by 1 bit from the foregoing 2nd embodiment and respectively becomes 1, 2, 3, 4 and 5 bits:

(2) Also the number of bits of subtractors 621–625, for subtracting said lower limit boundary values from the 6-bit input data is reduced by 1 bit from that in the 2nd embodiment, and respectively becomes 1, 2, 3, 4 and 5 bits. However the results of the subtractions, to be supplied to the 2nd selector 452, have to be of 2, 3, 4, 5 and, 6 bits, respectively, as in the 2nd embodiment. Consequently the LSB's from the shifters 462–465 or the LSB of the input data is added, without passing said subtractors, to the outputs thereof to obtain desired numbers of bits.

Except for the registers 601–605 and the subtractors 621–625 mentioned above, all the circuit blocks are same as those in the foregoing 1st and 2nd embodiments.

As the present embodiment is obtained by eliminating the redundancy from the operational circuit of the 2nd embodiment (FIGS. 8A and 8B), based on the redundancy (LSB=0) of the lower limit boundary values shown in FIG. 9, the result obtained in this embodiment is naturally identical with that of the 2nd embodiment.

The three embodiments explained above function satisfactorily in case the maximum code length of the Huffman codes is 6 bits.

Stated differently, they can satisfactorily decode any Huffman code system as long as the maximum code length is 6 bits.

However, they do not function satisfactorily if the maximum code length is 5 bits or less. Naturally they are not applicable to the case where the maximum code length is 7 bits or larger.

For example, for a Huffman code system as shown in FIG. 11, the lower limit boundary values (represented in 6 bits) for the different code lengths, determined according to the aforementioned rules become as shown in FIG. 12. Thus the lower limit boundary value for the 6-bit codes becomes "000000" in 6-bit representation, so that all the Huffman codes will be identified as having a code length of 6 bits or larger.

For avoiding such erroneous identification, there can be conceived the following three methods. The first method consists of, in the 1st embodiment shown in FIGS. 4A and 4B, changing the content of the register 405 retaining the lower limit boundary value to "111111", then additionally providing means for detecting said value and correcting the result of comparison of said lower limit boundary value and the input data by the result of said detection in such a manner that a result "(said lower limit boundary value)>(input data)" can always be obtained.

The second method consists of, in the 1st embodiment shown in FIGS. 4A and 4B, extending the registers 401–405 for retaining the lower limit boundary values from 6 bits to 7 bits, thereby extending the lower limit boundary values to "1000000" at maximum, also extending the 6-bit input data to 7 bits by attaching a bit "0" to the uppermost bit, and effecting comparison thereof with the above-mentioned boundary values of 7 bits.

The third method consists of expanding the registers for retaining the lower limit boundary values to 7 bits as in the above-explained second method, thereby expanding the lower limit boundary value to "1000000" at maximum, but conducting the comparisons with the input data by the 6 bits excluding the uppermost bit (MSB), and taking the results of the comparisons with 6 bits as the results of comparison of the input data and the lower limit boundary values if the MSB is "0" but providing a result representing a relation "(lower limit boundary value)>(input data)" if the MSB is "1", regardless of the results of comparison with 6 bits.

Figure 13:
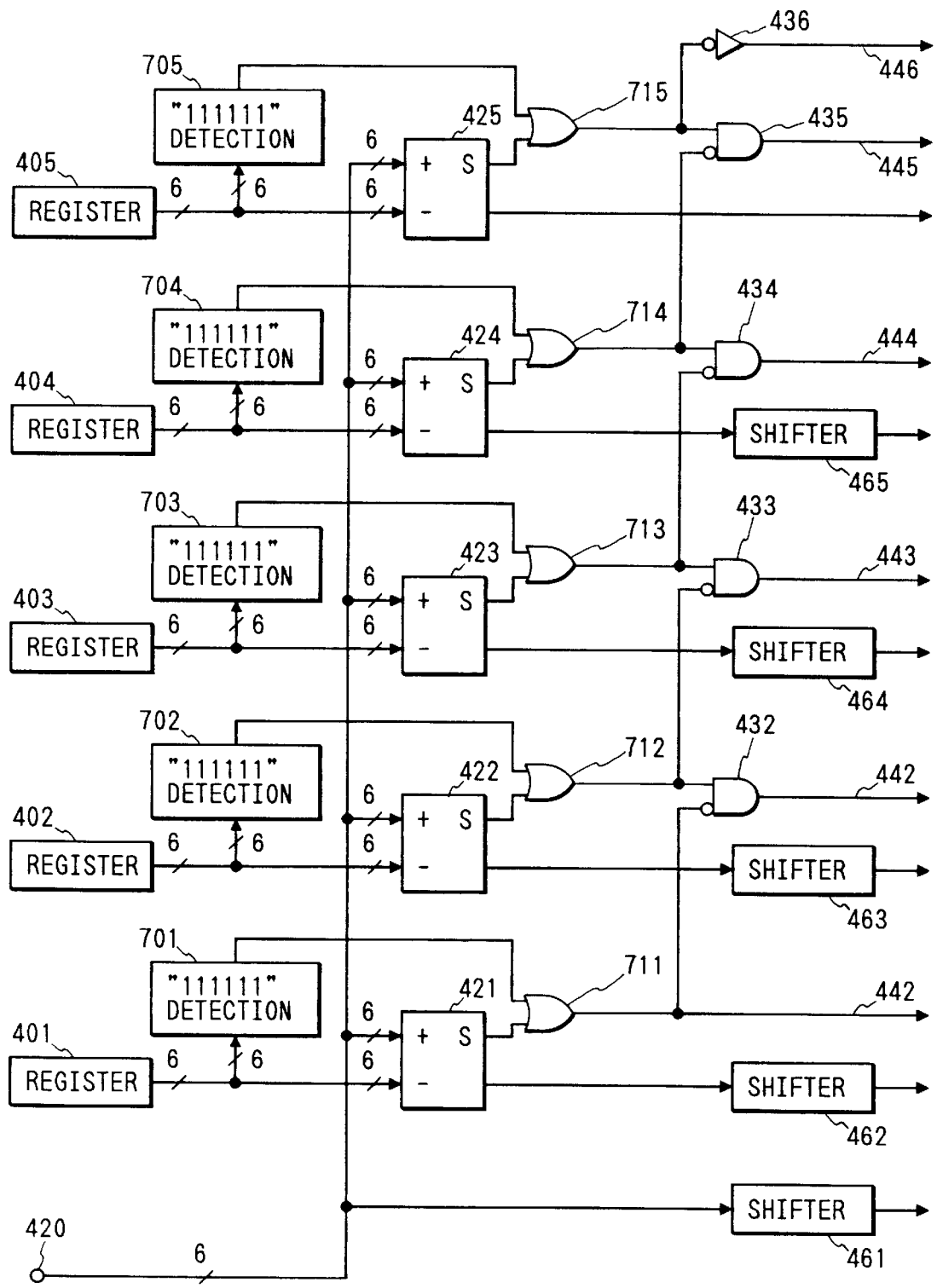
FIG. 13 is a circuit diagram of a fourth embodiment of the present invention.

FIG. 13 illustrates an operational circuit of a fourth embodiment of the present invention, based on the above-mentioned first method. However, the configuration of the registers 411–415 for retaining the code numbers, the priority encoder 453, the 1st selector 451, the second selector 452 and the output side are omitted as they are same as those shown in FIGS. 4A and 4B.

In comparison with the first embodiment shown in FIGS. 4A and 4B, the present embodiment is added only with "111111" detection blocks 701–705 and 2-input OR gates 711–715.

In decoding the Huffman codes of maximum code length of S bits, "111111" is set in the registers (a part of registers 401–405) retaining the lower limit boundary values for (S+1) bits or larger but not exceeding 6 bits, and is detected by the above-mentioned "111111" detecting blocks 701–705, whereby a signal "1" is output from the OR gates 711–715. In this manner only the comparisons with the lower limit boundary-values for S bits or less become effective and the decoding operation becomes possible.

The concept of this embodiment is easily applicable also to the second embodiment (FIGS. 8A and 8B). In the 2nd embodiment, the lower limit boundary value for the i-bit codes is retained in a register of i bits, so that the aforementioned "111111" setting operation is replaced by an operation of setting "1" in all the i bits of such register, and only the comparisons with the lower limit boundary values for S bits or less can be made effective by detecting the all "1" bits and outputting a signal "1" from the OR gates 711–715.

Figure 14:
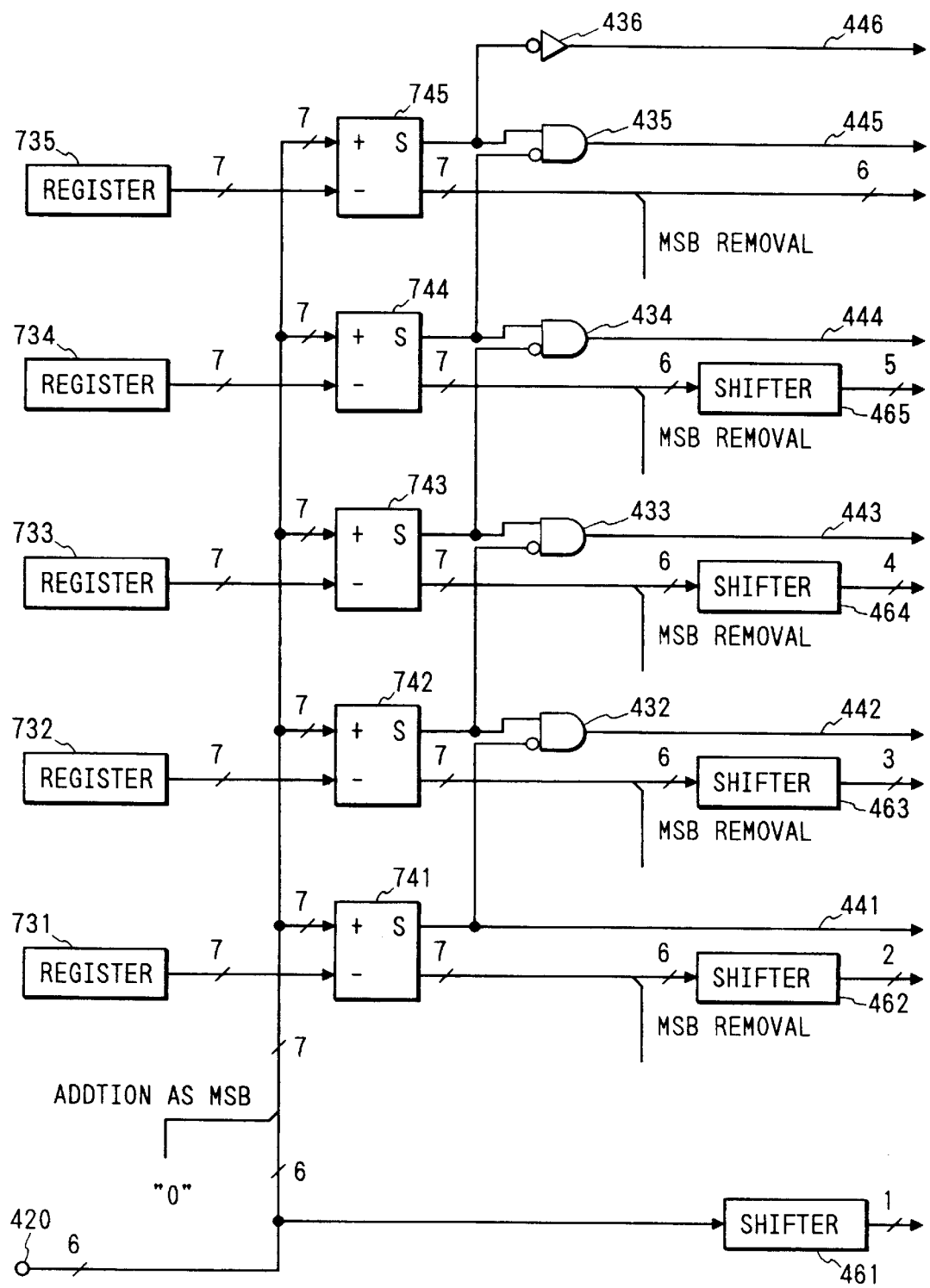
FIGS. 14 and 15 are circuit diagrams of variations of the fourth embodiment.

FIG. 14 illustrates an operational circuit of the 4th embodiment of the present invention, based on the above mentioned second method. As in FIG. 13, the registers 411–415, priority encoder 451, 1st and 2nd selectors 451, 452 etc. are omitted.

In comparison with the 1st embodiment (FIG. 4), this embodiment is different in that 7-bit registers 731–734 are used, instead of 6-bit registers, for retaining the lower limit boundary values, and that 7-bit subtractors 741–745 are used for effecting the subtraction of the input data with 7 bits. In this embodiment, in decoding the Huffman codes of maximum code length of S bits, a value "1000000" is retained as the lower limit boundary value for (S+1) to 6 bits. Thus the relation "(lower limit boundary value)>(input data)" stands for any 6-bit input data, so that only the comparisons with the lower limit boundary values for S bits or less can be made effective and the decoding operation can be made possible.

Figure 15:
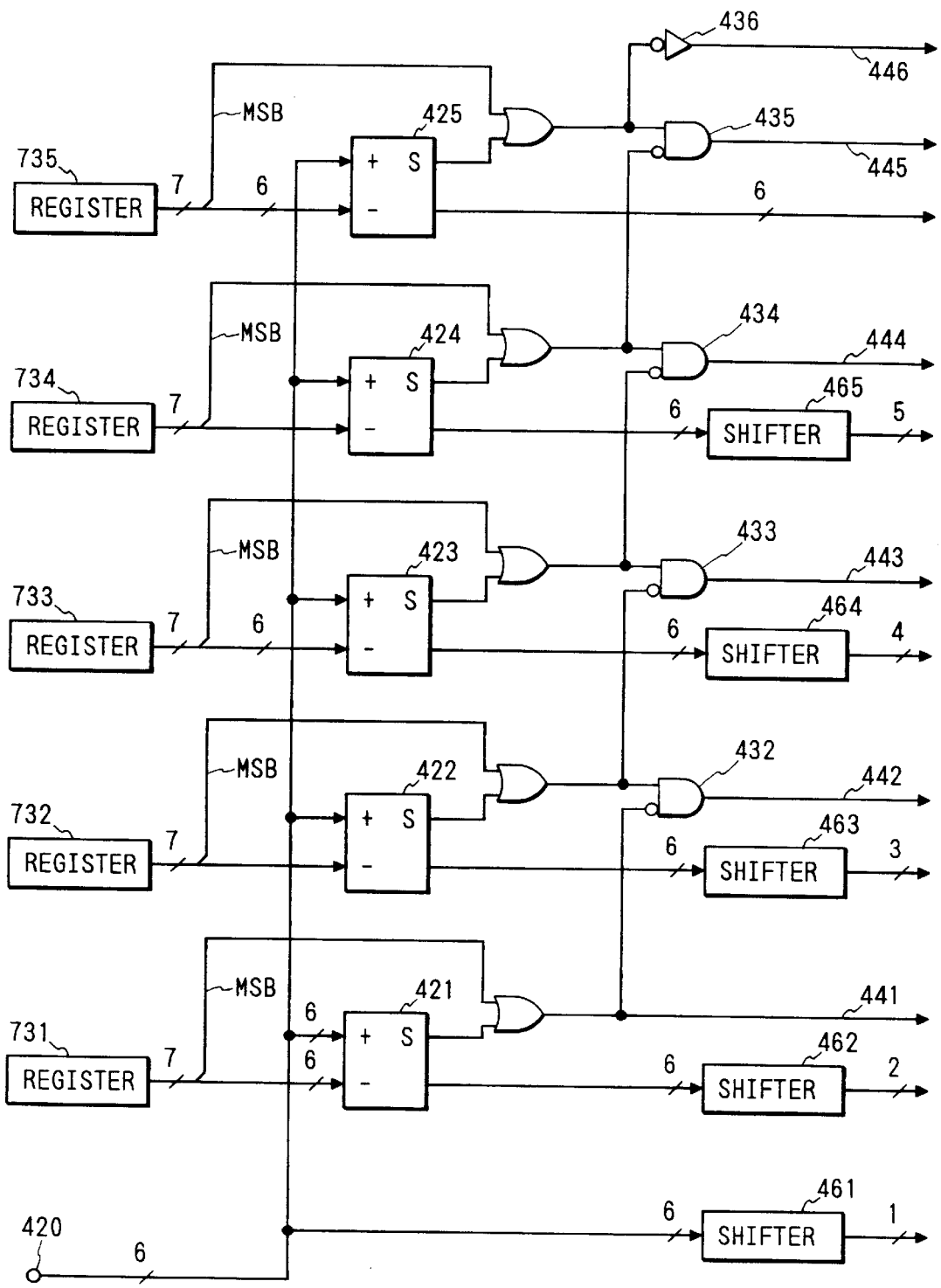

FIG. 15 illustrates an operational circuit of the 4th embodiment of the present invention, based on the aforementioned third method. As in FIG. 13, the registers 411–415, priority encoder 451, 1st and 2nd selectors 451, 452 etc. are omitted.

In this embodiment, the lower limit boundary values for i-bit codes are retained in the same manner as in the embodiment shown in FIG. 14, but the subtractions with the input data are conducted in the lower 6 bits only, and the most significant bit (MSB) is subjected to a logic summation, in 2-input OR gates 711–715, with the sign bits output from the subtractors. Also in this configuration, only the comparisons with the lower limit boundary values for code lengths less than the maximum code length can be made effective, whereby the decoding operation is made possible.

The embodiment shown in FIG. 14 or 15 can also be applied easily to the 2nd or 3rd embodiment.

Figure 16B:
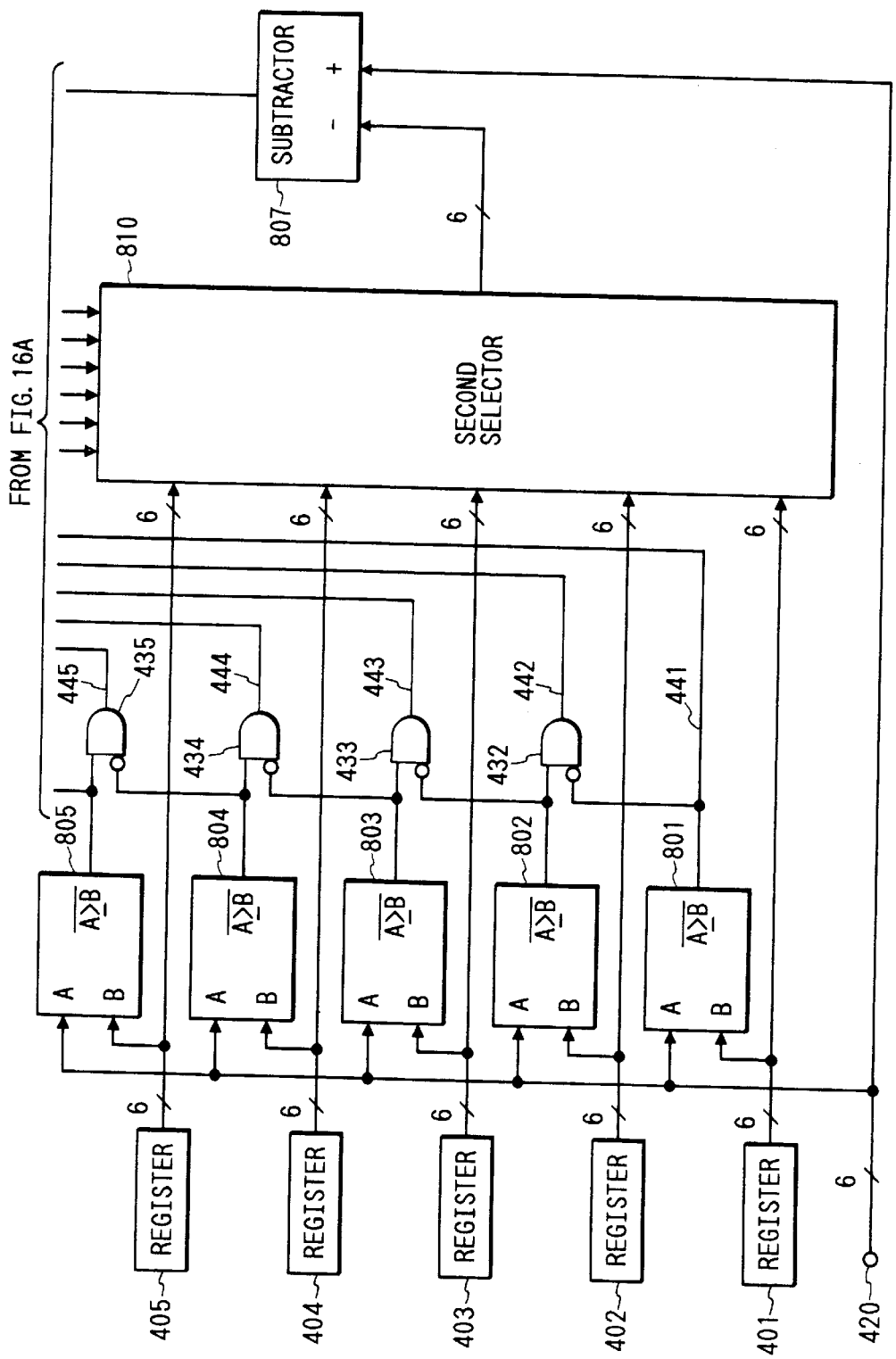

A 5th embodiment of the present invention is shown in FIGS. 16A and 16B.

In the foregoing four embodiments, the function of comparing the input data with the lower limit boundary values and the function of determining the differences between the input data and the lower limit boundary values are realized solely with subtractors. For this reason, plural subtractors are required for parallel comparison of the input data with plural lower limit boundary values.

However, since the subtractor, having both the comparing function and the difference calculating function, is two to three times larger in the magnitude of the hardware, in comparison with the simple comparators, the use of a plurality of such subtractors leads to an increased cost of the decoding device.

In the present embodiment the comparing function and the difference determining function are separated and are respectively achieved by a comparator and a subtractor, and there is provided an operational unit for determining the code number and the code length, utilizing plural comparators in combination with a single subtractor.

The Huffman codes to be decoded are assumed to belong to a code system same as that in the 1st embodiment and as shown in FIGS. 5 and 6.

In FIGS. 16A and 16B, there are provided plural comparators 801–805 and a subtractor 807, both mentioned above. Also there are provided a shifter 809 of which shift amount is controlled according to the code length signal; and a 2nd selector 810 effecting the same selecting operation as that of the 1st selector 451. Other blocks are identical, in functions, with those of same numbers in the 1st embodiment shown in FIGS. 4A and 4B.

For explaining the function of the circuit shown in FIGS. 16A and 16B, let us consider a case of entry of 6-bit data "111010" into the terminal 420, as in the explanation of the function of the 1st embodiment. Said 6-bit data are compared, in comparators 801–805, with all the lower limit boundary values for 2- to 6-bit codes, retained in the registers 401–405. Each comparator has input terminals A and B, and outputs a signal "0" in case (A-input data)≧(B-input data) Consequently the "0" in case (A-input data)≧ (B-input data). Consequently the output signals of the comparators 801–805 become equal to the sign bit output signals of the subtractors 421–425 in the 1st embodiment (FIGS. 4A and 4B), so that the signals on the lines 441–446, the output signal to the 1st selector and the output signal to the priority encoder are same in both embodiments.

The 2nd selector 810 is different, in the number of input signals and in the number of bits of the signals, from the second selector 452 in the 1st embodiment (FIGS. 4a and 4B). Said 2nd selector 810, effecting the same selecting operation as that of the 1st selector 451 as already explained above, selects and outputs, with reference to said input data, the data "110000" supplied from the register 403. The data "110000" are supplied to the (−)-input terminal of the subtractor 807, of which the (+)-input terminal receives the 6-bit data "111010" entered from the terminal 420, whereby the subtractor 807 effects a subtraction "111010−110000" and outputs 6-bit data "001010" for supply to the shifter 809. the shifter 809, receiving the code length signal from the priority encoder 453, as a signal for controlling the shift amount, effects a shift of (6−t) bits to the right when the code length is t, and outputs lower 4 bits only. In the present example, in which the code length=4, the input data "001010" to the shifter are shifted by 2 bits to the right to become "000010", of which lower 4 bits "0010" are output from the shifter 809. This output is added, in the adder 473, with the output signal "0010" of the 1st selector 451, whereby a sum $0101_2=5$ is output from the terminal 475.

In this manner the present embodiment provides the code length=4 and the code number=5 for the 6-bit input data "111010", as in the foregoing embodiments.

The technologies of the foregoing 2nd to 4th embodiments may be applied, in combination, to the present embodiment. However, in case of application of the technologies of the 2nd and 3rd embodiments, the shifter 809 has to be positioned at the side of the (+)-input terminal of the subtractor 807, instead of the output side thereof.

Figure 17:
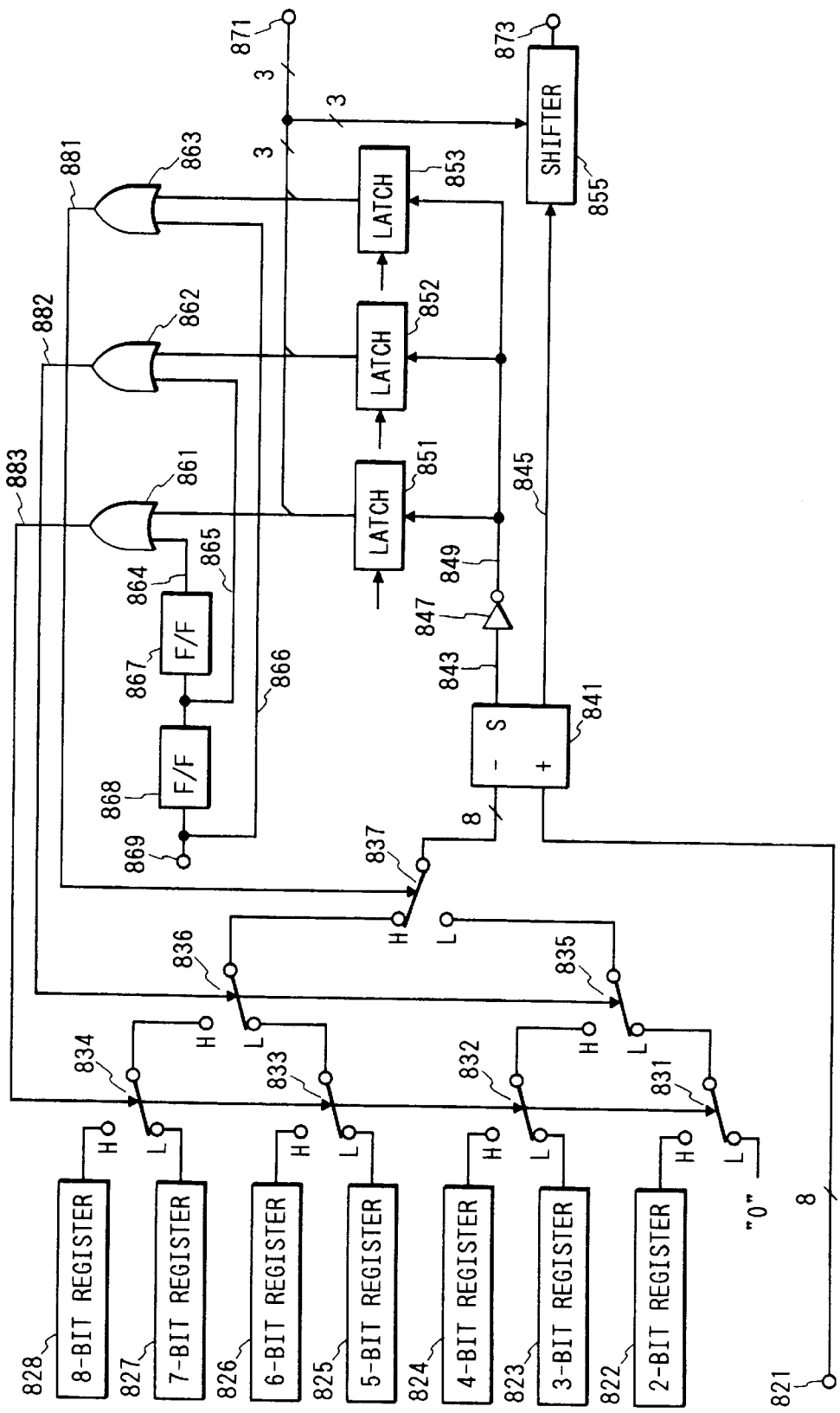
FIG. 17 is a circuit diagram of a sixth embodiment of the present invention.

A 6th embodiment of the present invention is shown in FIG. 17.

The present embodiment is featured by a fact that the function of comparing the input data with the lower limit boundary values and the function of determining the differences between the input data and said lower limit boundary values are achieved by a single subtractor.

Consequently the magnitude of the hardware can be made even smaller than in the foregoing 5th embodiment, but the process time required for decoding a Huffman code becomes longer, because the comparisons of k times, required for decoding a Huffman code of $2^k$ bits, have to be conducted in a single subtractor.

As explained in the foregoing embodiments, the determination of the code number involves a final step of addition of two values, namely a code number corresponding to the lower limit boundary value and a difference between the input data (or Huffman code to be decoded) and the lower limit boundary value. While the difference between the input data and the lower limit boundary value can be determined in various methods (as explained in the foregoing embodiments), the code number corresponding to the lower limit boundary value can almost only be determined by retaining the code numbers, respectively corresponding to the plural lower limit boundary values, in plural registers and selecting one of the outputs of said registers. The selector may be provided in different structures, but there will not be a basic difference among such structures. Consequently, in the present embodiment, there will only be explained the part determining the code length and the part determining the difference between the input data and the lower limit boundary value, and other parts will be omitted.

In the present embodiment, the maximum code length is assumed as k=3, or 8 bits. In such case, there exist 7 lower limit boundary values for comparison (corresponding to 2 to 8 bits), and the values are retained in registers 822–828.

A lower limit boundary value is selected by selectors 831–837, from the 7 lower limit boundary values retained in the registers 822–828, and is supplied to the (−)-input terminal of a subtractor 841. On the other hand, 8-bit input data (input data being also 8 bits, because the maximum code length is 8 bits) are entered through a terminal 821 and supplied to the (+)-input terminal of the subtractor 841, which effects a subtraction of "8-bit input data" minus "selected lower limit boundary value", together with comparison, whereupon the sign bit and the difference are supplied respectively to signal lines 843, 845. The sign bit signal on the signal line 843, indicating the result of comparison of the two data supplied to the subtractor 841, is inverted by an inverter 847 into a signal 849, which is latched in three latches 851–853 at different timings. Said latches 851–853 are all cleared to "0" at the initialization and then fetch the result of comparison in the order of 853, 852 and 851 in succession, where by obtained is a 3-bit signal in which the outputs of the latches 853 and 851 respectively constitute MSB and LSB.

Said 3-bit signal, representing the code length, is supplied to a terminal 871 and to a shifter 855. Also the result of comparison fetched in the latches 851–853 is fed back to the selectors 831–837, and, in this operation, other signals 864–866 are synthesized by OR gates 861–863. The signals 864–866 are used for forcedly shifting selector control signals 881–883 to "1", one at a time. In the first cycle, the signal 866 alone becomes "1" by a positive pulse supplied to a terminal 869, while other signals 864, 865 remain as "0". The pulse is delayed by a cycle each time, by delay elements 868, 867 such as D-flip-flops, so that the signal 965 or 866 alone becomes "1" in the 2nd or 3rd cycle.

The code length information output from the terminal 871 indicates the actual code length minus one. More specifically, the code length information is "111" or "000" respectively for an actual code length of 8 bits or 1 bit.

In the present embodiment, the code length information is determined from the MSB side, by a bit at a time based on the two-division method, and the determination is achieved by the above-explained hardware. In the first cycle, among the three selector control signals 881–883, the signal 881 alone becomes "1" while other signals 882, 883 remain as "0", whereby the selectors 831–837 effect a selecting operation as shown in FIG. 17 to select the lower limit boundary value retained in the register 825. The selected value is supplied to the (−)-input terminal of the subtractor 841 and is compared with the 8-bit input data supplied to the (+)-input terminal from the terminal 821.

The result of said comparison is output, as the sign bit, to the signal line 843, then inverted by the inverter 847 and fetched in the latch 853. A state "1" of the inverted signal 849 indicates a state where (8-bit input data)≧(selected lower limit boundary value), so that the comparisons with smaller boundary values (retained in the registers 822–824 in this case) than the above-mentioned boundary value are no longer necessary in the next cycle. Consequently the selector 837 is so controlled as to continue to select an H-side terminal, by the supply of the signal, fetched in the latch 853, to the selector 837 through the OR gate 863.

On the other hand, a state "0" of the inverted signal 849 indicates a state where (8-bit input data)<(selected lower limit boundary value), so that the comparisons with boundary values (in the registers 825–828) equal to or larger than the above-mentioned boundary value. Consequently the selector 837 are so controlled as to continue to select an L-side terminal, by fetching "0" in the latch 853.

In the present example, the signal obtained by inversion of the sign bit is assumed to be "1". In the next cycle, the signal 882 newly becomes "1", whereby the selectors 835, 836 are shifted from the L-side terminals to the H-side terminals. As a result, the lower limit boundary value retained in the register 827 is selected and supplied to the (−)-input terminal of the subtractor 841.

The 8-bit data, same as in the previous cycle, are supplied to the (+)-input terminal of the subtractor 821 and are compared with the lower limit boundary value, and the result of the comparison is fetched in the latch 852 through the inverter 847. If the fetched signal is assumed as "0", the signal 882 returns to "0" in the next cycle, whereby the selectors 835, 386 are shifted from the H-side terminals to the L-side terminals. The signal line 883 newly becomes "1", whereby the selectors 831–834 are shifted from the L-side terminals to the H-side terminals. As a result, the lower limit boundary value retained in the register 826 is selected and supplied to the (−)-input terminal of the subtractor 841.

Said boundary value is compared with the 8-bit input data as in the previous cycle, and the result of comparison is fetched in the latch 851 through the inverter 847. If the fetched signal is assumed to be "0", the signal 883 returns to "0" in the next 4th cycle, whereby the selectors 831–834 are shifted from the H-side terminals to the L-side terminals.

The foregoing three comparisons indicate that the Huffman code, constituting the 8-bit input data, are at least equal to the lower limit boundary value for 5-bit codes retained in the register 825 but is smaller than that for 6-bit codes retained in the register 826, so that the code length is identified as 5 bits. The information "100" indicating the code length is retained in the latches 853, 852, 851 and is supplied to the terminal 871.

In the 4th cycle after the three comparisons, the lower limit boundary value for 5-bit codes, retained in the register 825, is finally selected by the selectors 831–837, then the subtractor 841 effects the subtraction of (input data) minus (lower limit boundary value), and the obtained difference is supplied to the signal line 845. Said difference signal is shifted, in the shifter 855, according to the code length information and supplied to the terminal 873.

Figure 18:
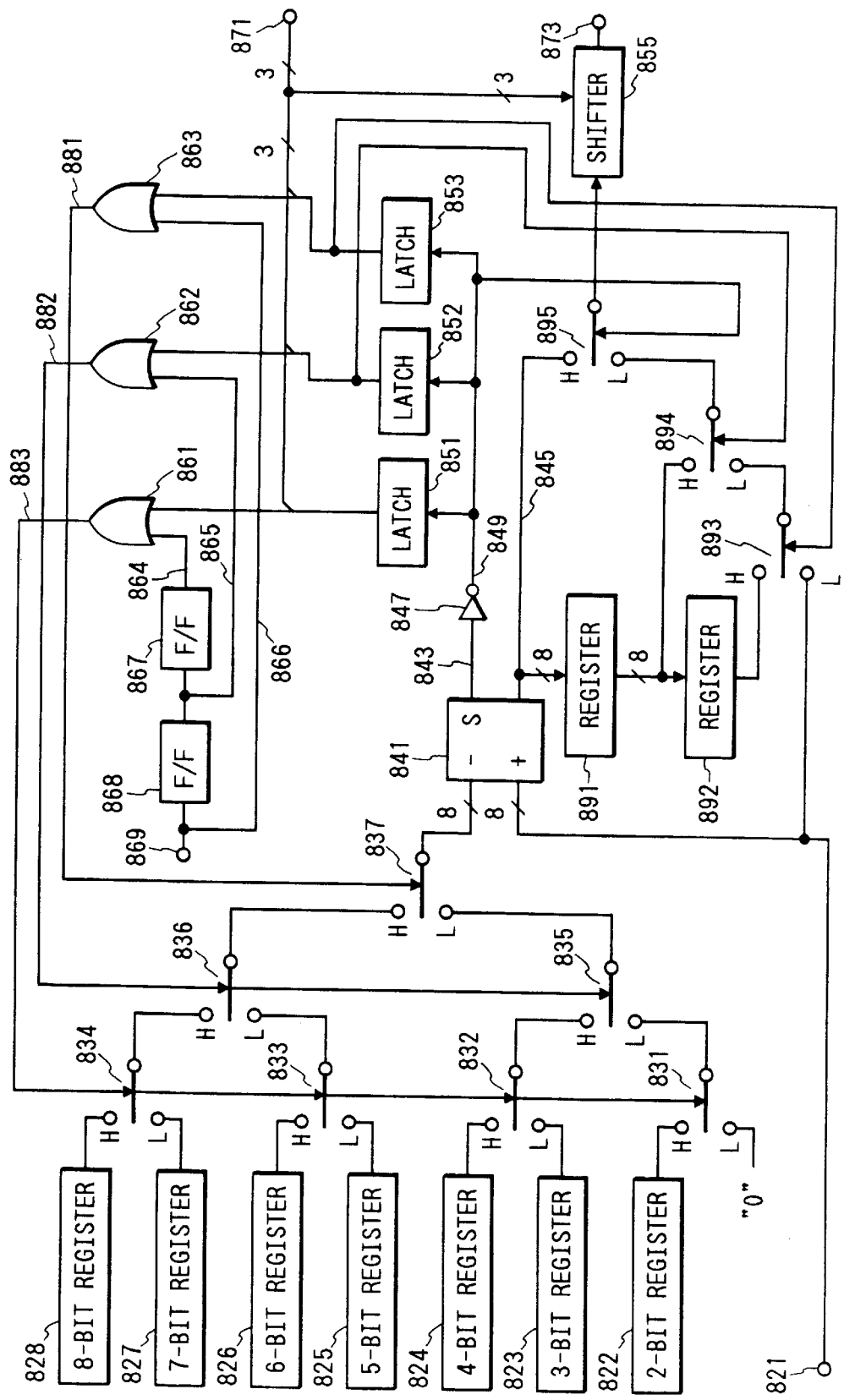
FIG. 18 is a circuit diagram of a seventh embodiment of the present invention.

A 7th embodiment of the present invention is shown in FIG. 18.

The foregoing 6th embodiment requires a process time of four cycles, for effecting three comparisons and a subtraction, in order to decode a Huffman code of 8 bits at maximum. The present embodiment decodes a Huffman code in three cycles, by retaining and effectively utilizing the result of subtraction, simultaneously generated in the comparison by the subtractor 841.

In FIG. 18, there are provided D-flip-flop registers 891, 892 of 8 bits each, for retaining the above-mentioned result of subtraction, and selectors 893–895 to be controlled by the result of comparison of the 8-bit input data and the selected lower limit boundary value. Other circuit blocks are identical with those in FIG. 17.

The following explanation will start from the operations in the third cycle, omitting those in the first and second cycles. In the third cycle, the results of subtractions in the 1st and 2nd cycles are respectively retained in the registers 892, 891. Also the uppermost bit, 2nd bit and lowermost bit of the code length information are respectively output from the latches 853, 852 and the inverter 847. In case the code length information assumes a form "XX1" (X being arbitrary), the difference (output 845 of the subtractor 841) obtained from the lower limit boundary value compared in the 3rd cycle remains effective, so that the difference is selected by the selector 895 and supplied to the shifter 855.

On the other hand, in case the code length information assumes a form "X10", the difference obtained from the lower limit boundary value compared in the 2nd cycle becomes effective, so that the difference retained in the register 891 is selected by the selectors 894, 895 and supplied to the shifter 855.

Also in case the code length information is "100", the difference obtained from the lower limit boundary value compared in the 1st cycle becomes effective (corresponding to the operation explained in the foregoing 6th embodiment), so that the difference retained in the register 892 is selected by the selectors 893–895 and supplied to the shifter 855.

In case the code length information is "000", the code length is 1 bit and the lower limit boundary value becomes zero. Consequently the 8-bit input data to the terminal 821 becomes the difference, so that the input data are selected by the selectors 893–895 and supplied to the shifter 855.

The difference supplied to the shifter 855 is shifted according to the code length information as in the foregoing 6th embodiment, and output to the terminal 873.

Figure 19:
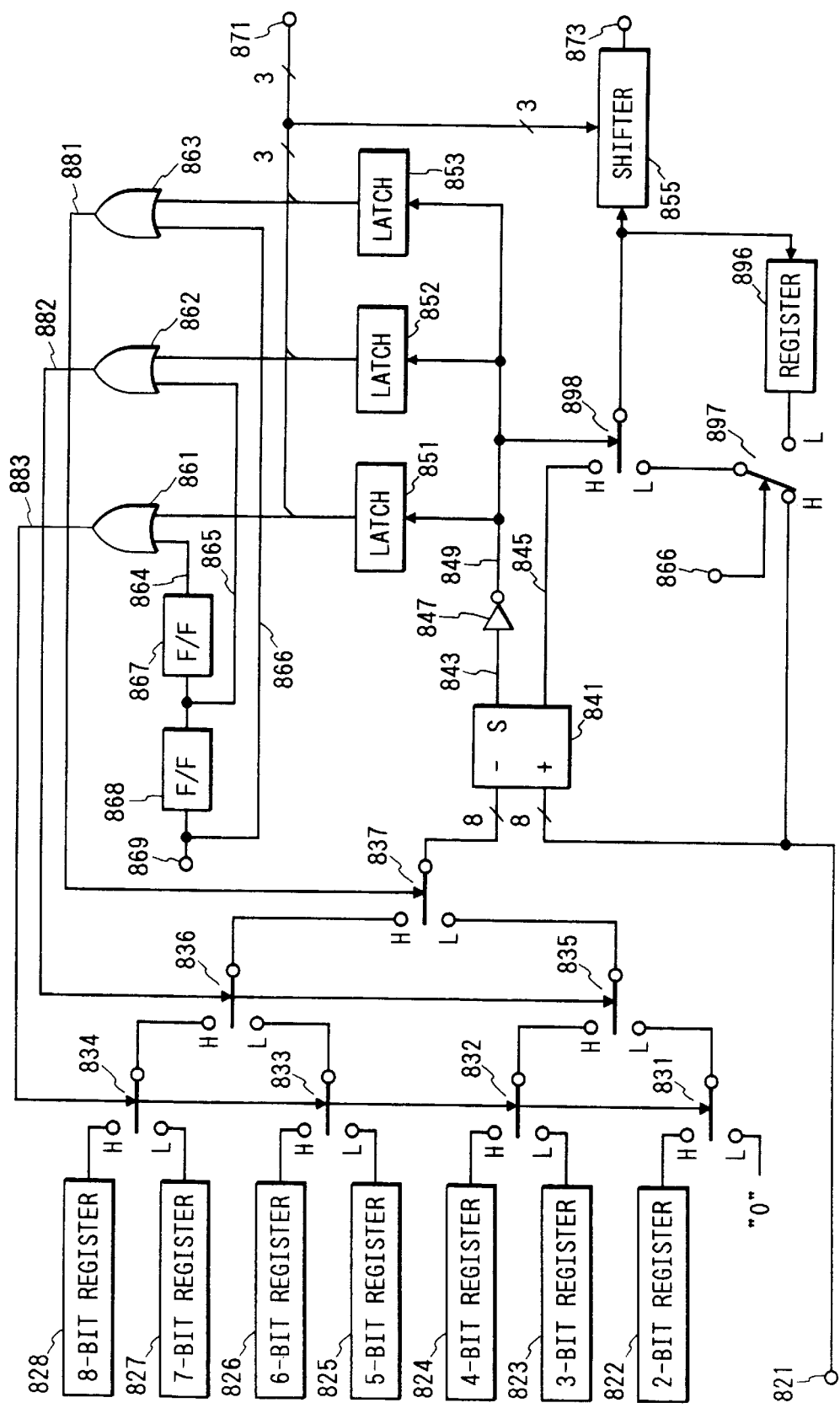
FIG. 19 is a circuit diagram of an eighth embodiment of the present invention.

An 8th embodiment of the present invention is shown in FIG. 19.

This embodiment achieves the process same as in the foregoing 7th embodiment, with a reduced hardware.

In FIG. 19, there are provided a D-flip-flop register 896 for retaining the difference, and a selector 897 to be controlled by a signal entered from a terminal 866, which receives such a signal as to select the H-side only in the 1st cycle and the L-side in the 2nd and 3rd cycles.

A selector 898 is controlled by a signal 849, output from the inverter 847 and indicating the result of comparison.

In case the signal 849, indicating the result of comparison in the 1st cycle is "1", and if the difference output from the subtractor 841 is "0", the 8-bit input data are selected by the selectors 897, 898 and supplied to the register 896.

In the 2nd cycle, the input data to the register 896 in the 1st cycle are output and supplied to the L-side input terminal of the selector 898 through the selector 897. Then, in case the signal 849, indicating the result of comparison of the input data and the lower limit boundary value, is "0", the output of the register 896 is selected by the selector 898 and entered again into the register 896. On the other hand, in case the result of comparison is "1", the difference newly calculated in the subtractor 841 is selected by the selector 898 and entered into the register 896.

In the 3rd cycle, the selectors 897, 898 function similarly as in the 2nd cycle, and the signal selected by the selector 898 is shifted in the shifter 855 according to the code length information and output from the terminal 873.

The above-explained operations achieve, by a single register, a process similar to that in the foregoing 7th embodiment.

Figure 20B:
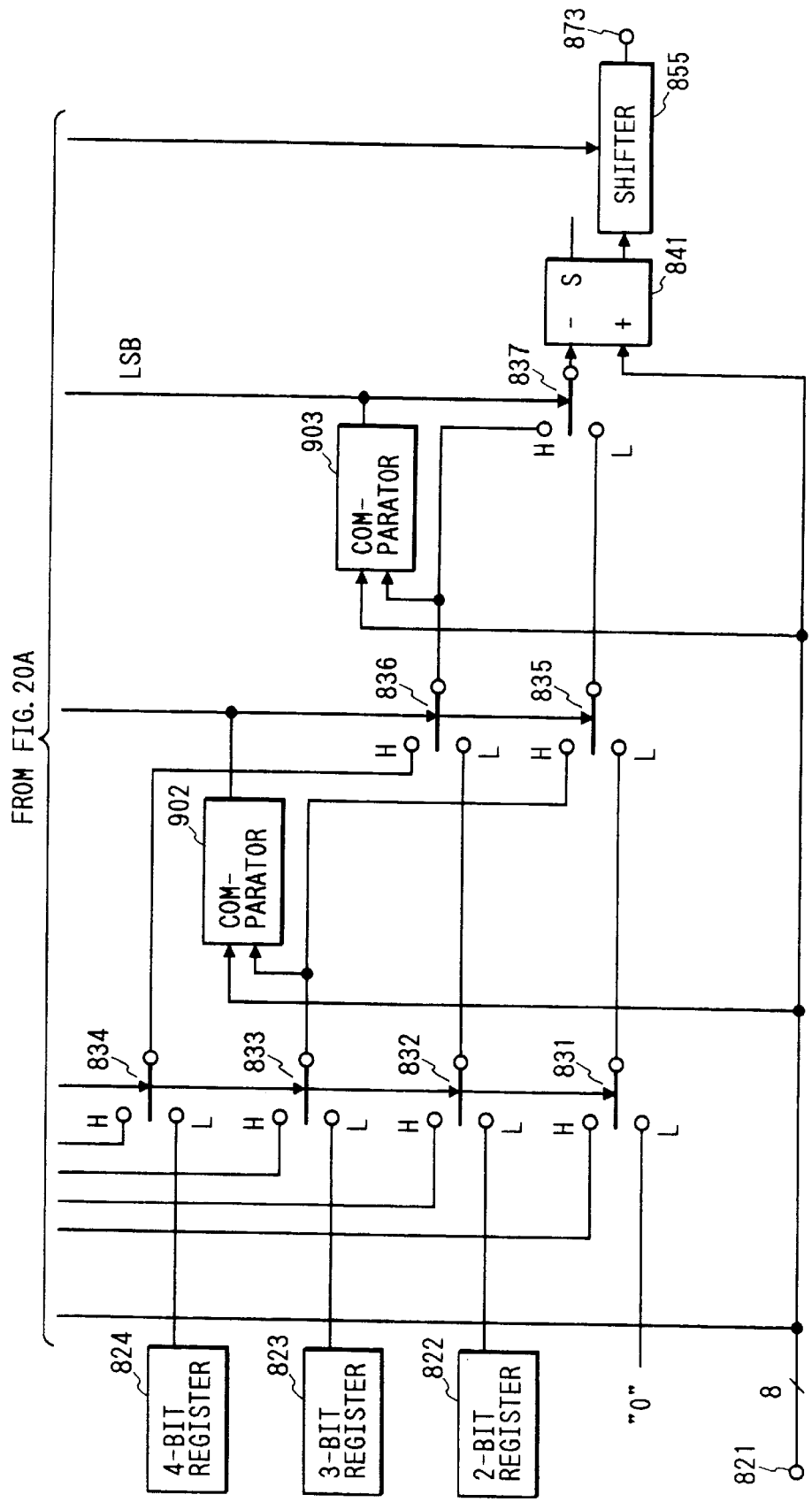

A 9th embodiment of the present invention is shown in FIGS. 20A and 20B.

The foregoing 6th to 8th embodiments employ a subtractor and require a process time of three to four cycles for decoding a Huffman of 8 bits at maximum.

The present embodiment enables decoding in a cycle, by the addition of three comparators, significantly smaller in circuit magnitude than the subractor, though the process time becomes somewhat longer. In FIGS. 20A and 20B there are shown three added comparators 901–903, so positioned as to become equivalent to three comparisons in the foregoing 6th to 8th embodiments. The selectors 831–837 are controlled by the outputs of the comparators. The uppermost bit, 2nd bit and lowermost bit of the code length information are respectively output from the comparators 901, 902, 903 through a terminal 871. The lower limit boundary value selected by the selector 837 is supplied to the subtractor 841 and subjected to the subtraction with the 8-bit input data, and the obtained difference is supplied to the shifter 855, for a shifting process according to the code length information and then released to the terminal 873.

Figure 21B:
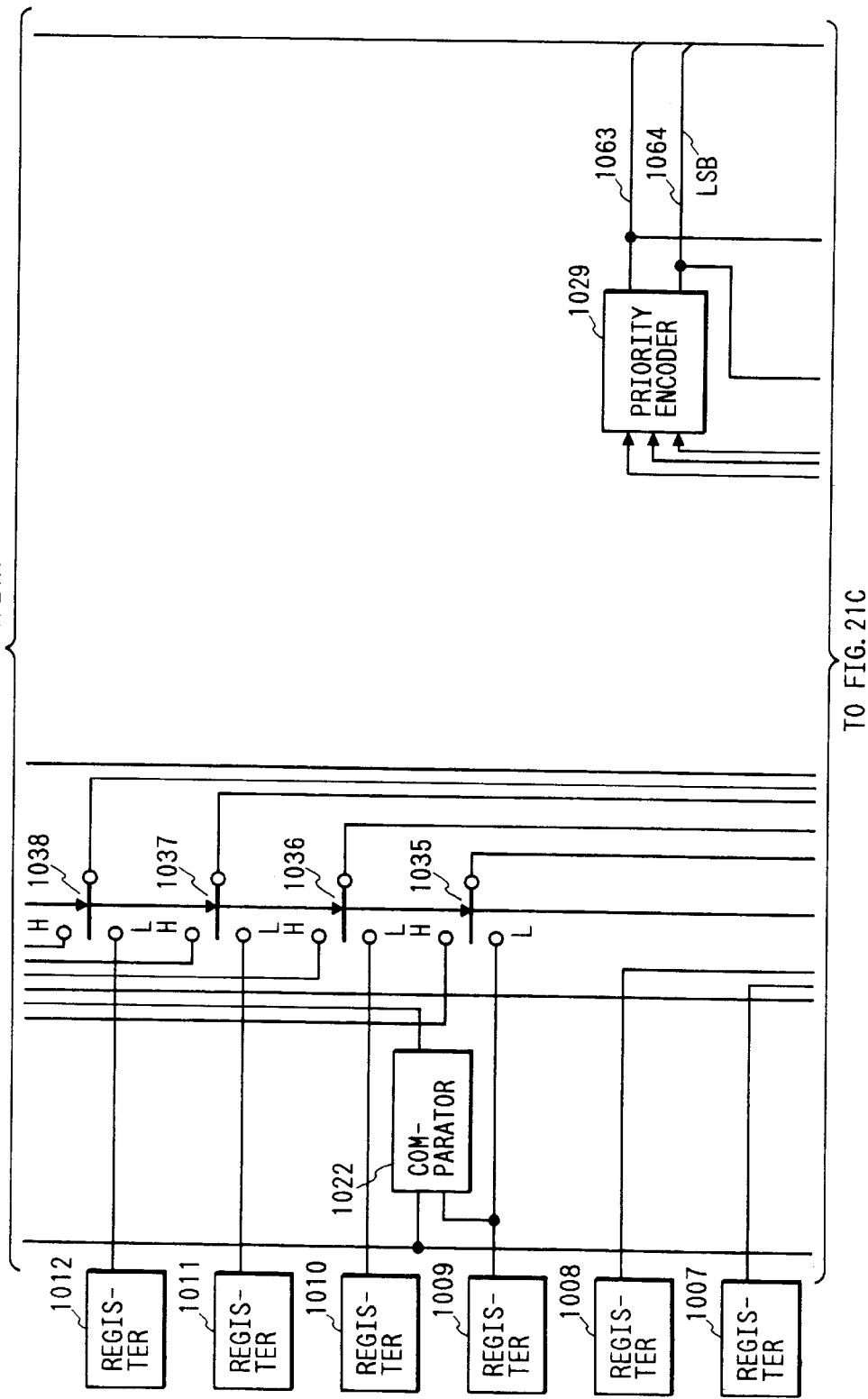
Figure 21C:
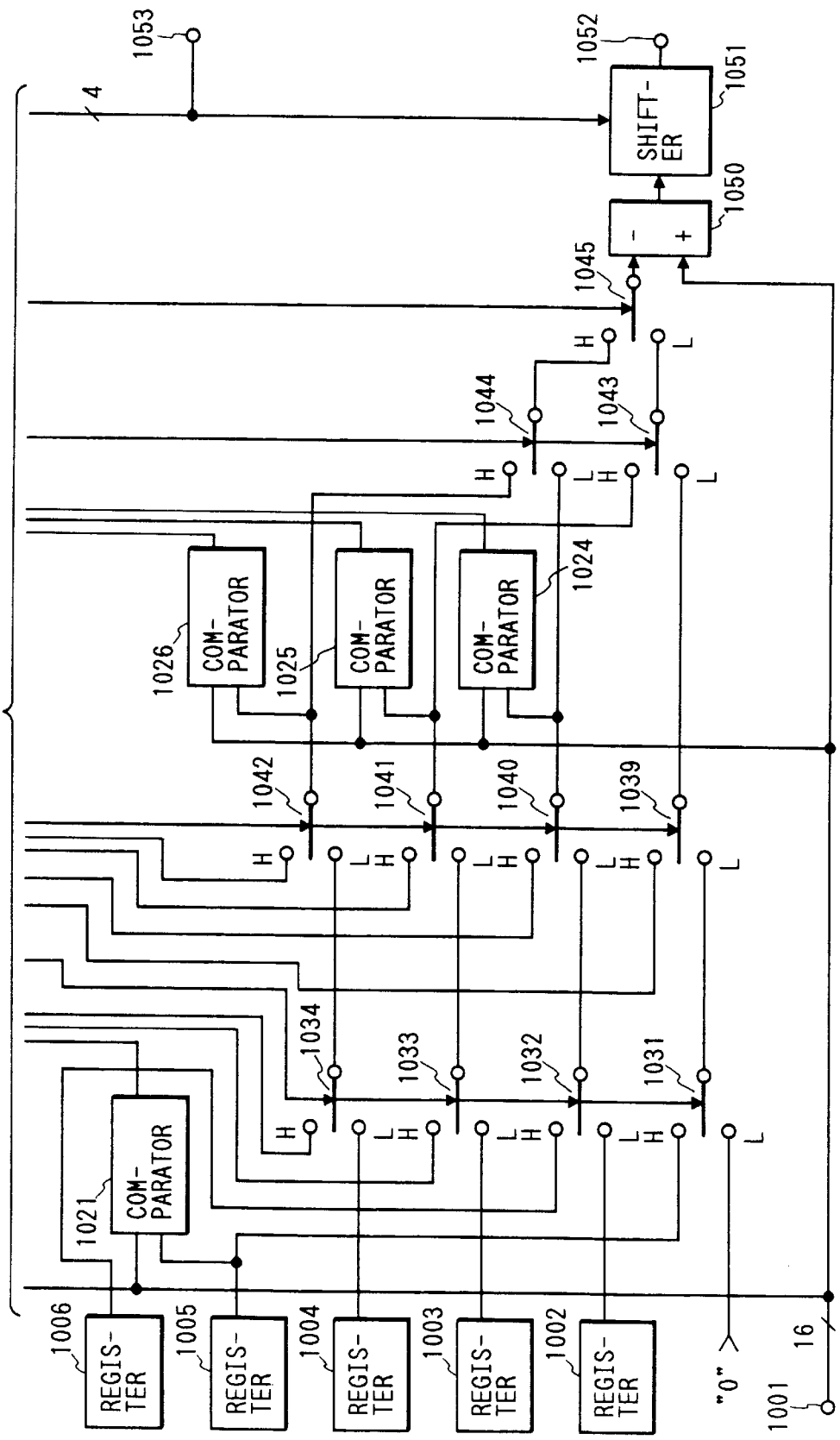

A 10th embodiment of the present invention is shown in FIGS. 21A to 21C.

Also this embodiment enables decoding in a cycle, by employing a subtractor and plural comparators as in the 9th embodiment.

However, in contrast to the 9th embodiment in which 1 bit of the code length information is generated from a comparator, two bits of the code length information are generated from the outputs of three comparators.

FIGS. 21A to 21C shows a part of the operational unit for determining the code length and the code number, for decoding Huffman codes of 16 bits at maximum.

The code length information, consisting of 4 bits, is output to a terminal 1053, and the difference required for determining the code number is output to a terminal 1052. The code length information is generated by two bits at a time as explained above. The upper two bits and the lower two bits are respectively generated by 1st and 2nd priority encoders 1028, 1029, each of which receives the outputs of the three comparators. More specifically, the 1st priority encoder 1028 receives the outputs of three comparators 1021–1023, while the 2nd priority encoder 1029 receive the outputs of three comparators 1024–1026. The 16-bits data to be decoded are entered from a terminal 1001. The lower limit boundary values for 2- to 16-bits codes are respectively retained in registers 1002–1016.

The 16-bit input data entered from the terminal 1001 are compared respectively with the lower limit boundary values for 5-, 9- and 13-bit codes in the comparators 1021–1023, and the code length is determined in one of four ranges of 1–4 bits, 5–8 bits, 9–12 bits and 13–16 bits, based on the results of said comparison. Thus determined result is reflected on two signals 1061, 1062 output from the 1st priority encoder, the signal 1062 controlling the selectors 1031–1038 while the signal 1061 controlling the selectors 1039–1042. In response, the selectors 1039–1042 output four lower limit boundary values corresponding to the determined code length range. Among the four boundary values, the larger three are compared with the 16-bit input data respectively in the comparators 1024–1026, and a code length is finally determined by the results of the comparisons. Then a lower limit boundary value corresponding to the code length is selected by the selectors 1043–1045 and supplied to a subtractor 1050, which effects the subtraction of (16-bit input data) minus (selected boundary value). The obtained difference is shifted in a shifter 1051, according to the code length, and is output from a terminal 1052.

Figure 22:
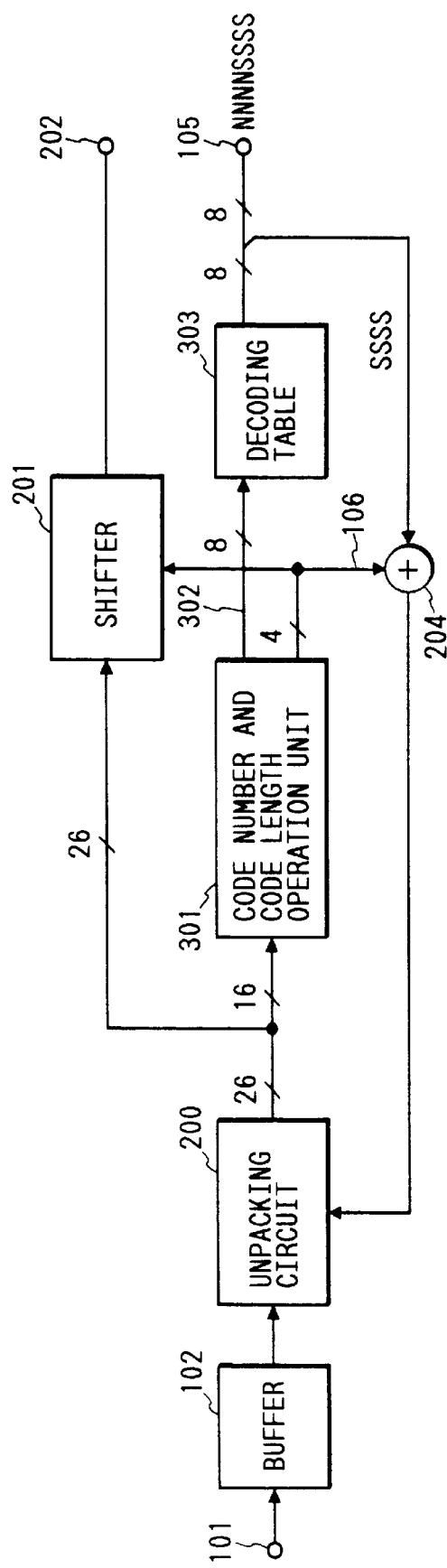
FIG. 22 is a circuit diagram of an eleventh embodiment of the present invention.

An 11th embodiment of the present invention is shown in FIG. 22.

In this embodiment, the method of determining the code number and the code length, explained in the foregoing 1st to 10th embodiments, is applied to a decoding device for codes proposed by JPEG.

The decoding table 104 of 64 k×12 bits in the conventional JPEG decoding device shown in FIG. 2 can be replaced, in the present embodiment, by a code number/code length calculating unit 301 and a decoding table with a memory capacity of only 256 bytes.

The present embodiment shows an example of the newly conceivable decoding device, by the application of the operational unit of the present invention for determining the code number and the code length, and the components of the present decoding device are same as those already explained in the foregoing embodiments.

Figure 23:
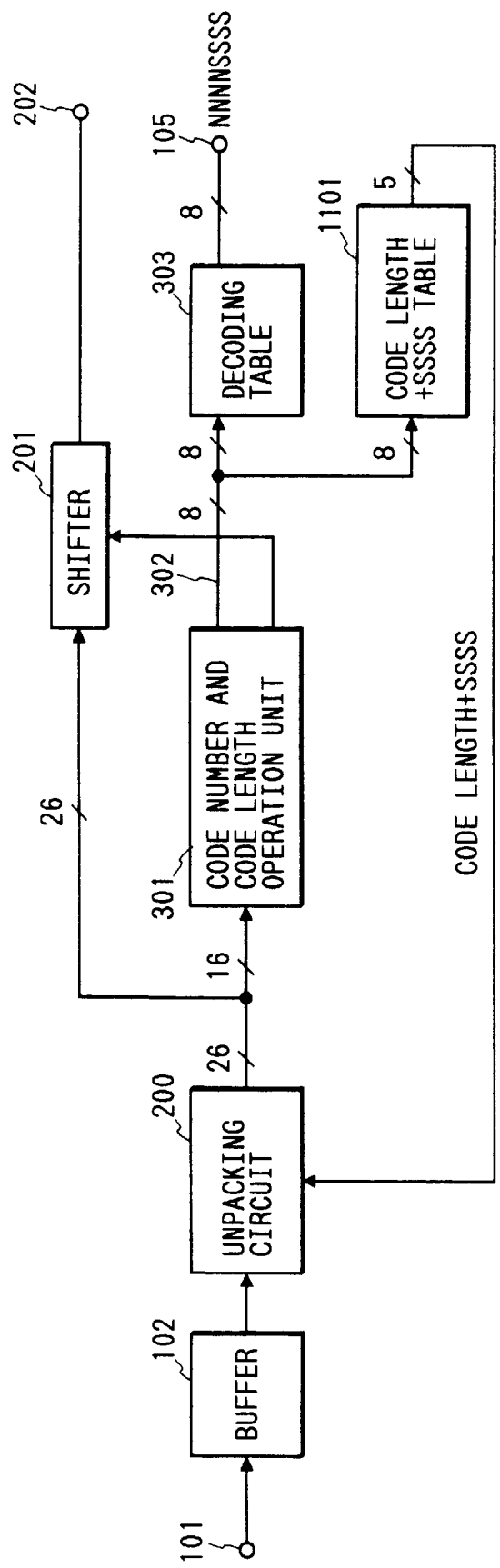
FIG. 23 is a circuit diagram of a twelfth embodiment of the present invention.

A 12th embodiment of the present invention is shown in FIG. 23.

The present embodiment is to increase the decoding process speed of the foregoing 11th embodiment, by employing a 2nd table 1101 storing the sums of the code lengths and the SSSS signals calculated in advance.

In the foregoing 11th embodiment, for obtaining the sum of the code length and the SSSS signal, the SSSS signal is read from a decoding table 303 and the code length from the operational unit 301 is added in an adder 204 (cf. FIG. 22). The present embodiment dispenses with the delay in the adder 204, thereby increasing the decoding speed. However, the 2nd table has a memory capacity of 256×5 bits=1.25 kbits, so that the memory capacity for the tables correspondingly increases, but the user can have the freedom of selecting either a higher process speed or a lower cost.

The configuration of the present embodiment is meaningful in case even a slight increase in the process speed is desirable.

Figure 24A:
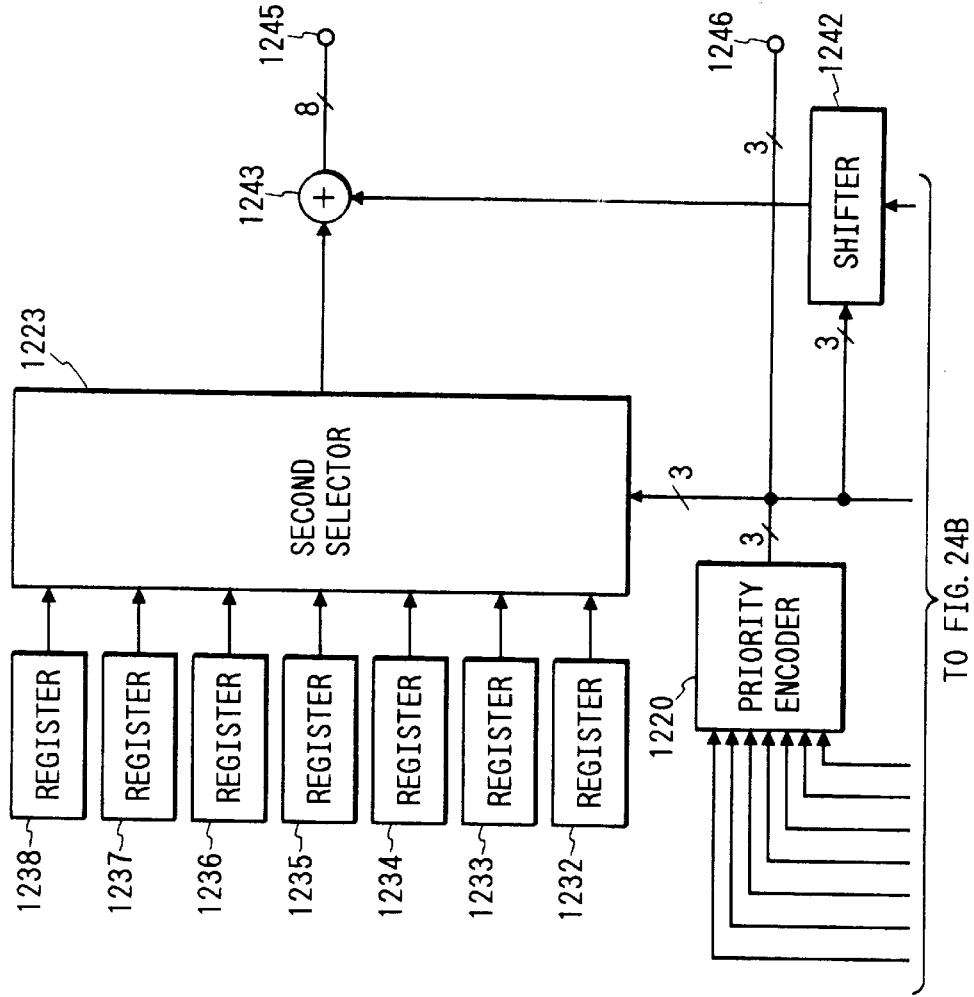
FIGS. 24A and 24B, when combined as shown in FIG. 24, show a circuit diagram of a thirteenth embodiment of the present invention.
Figure 24:
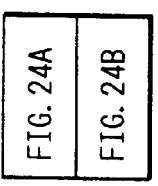
Figure 24B:
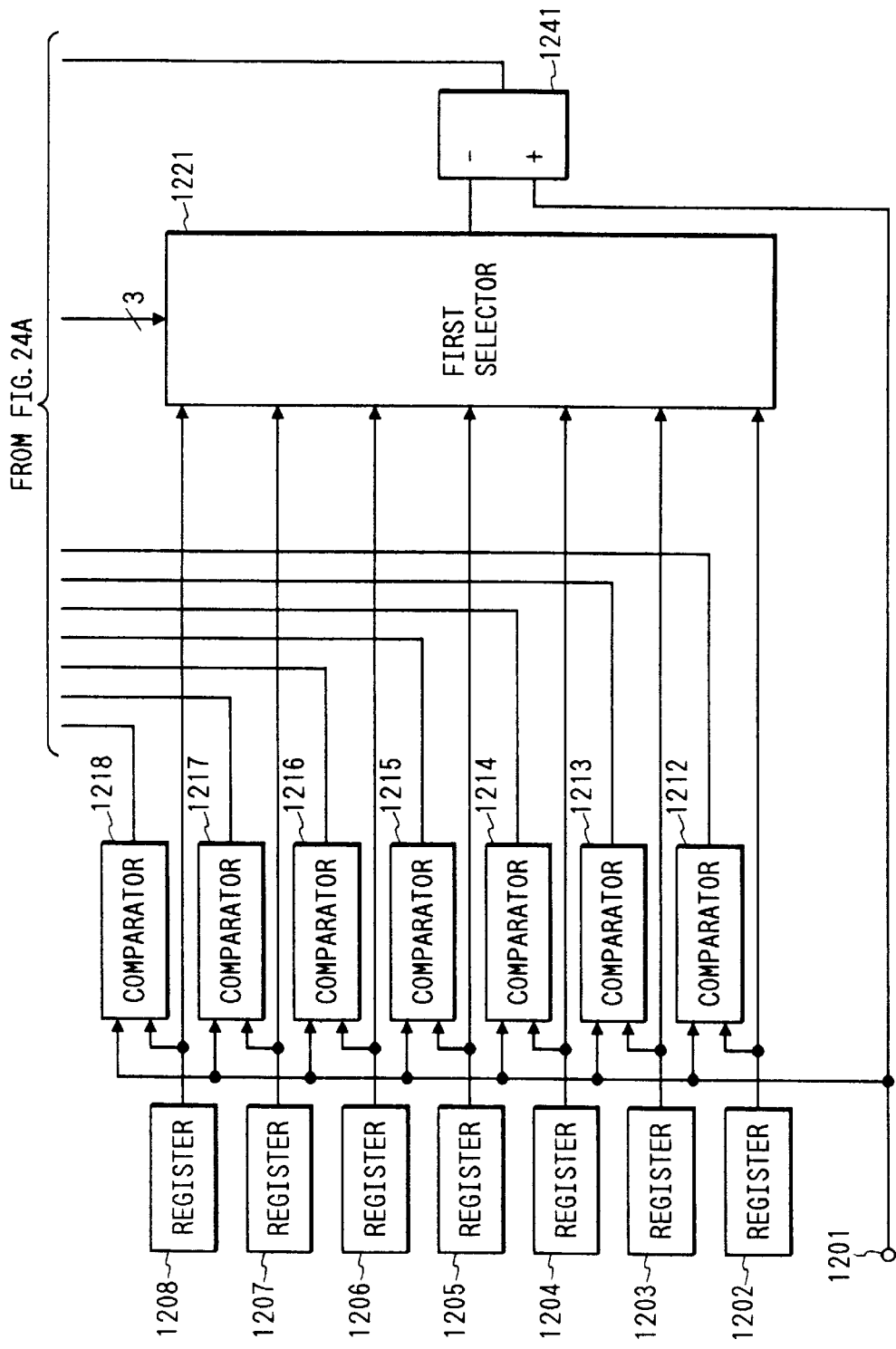

A 13th embodiment of the present invention is shown in FIGS. 24A and 24B.

The present embodiment is an application of the concept of the above-explained operational unit for determining the code number and the code length, to an encoding device.

The method of determining the code number in the foregoing 1st to 12th embodiments can be summarized as follows. In the following it is assumed that the maximum code length is 8 bits and that the code length of the Huffman code to be decoded is already determined as n bits.

Code number=(8-bit input data−lower limit boundary value for $n$-bit code)×$2^{-8+n}$+code number corresponding to lower limit boundary value for $n$-bit code  (1)

In this relation (1), the 8-bit input data indicate data including a Huffman, and the relation (1) can be rewritten for the data, which are represented as 8-bit Huffman data;

8-bit Huffman code=(code number−code number corresponding to lower limit boundary value for $n$-bit code)×$2^{8-n}$+lower limit boundary value for $n$-bit code  (2)

The upper n bits of the 8-bit Huffman code constitute the actual Huffman code.

FIGS. 24A and 24B show a circuit for effecting calculation according to the relation (2), provided further with a circuit for identifying the code length. In FIGS. 24A and 24B there are shown a terminal 1201 for entering the code number; registers 1202–1208 for retaining code numbers respectively corresponding to the lower limit boundary values for 2- to 8-bit codes (register for 1-bit code being unnecessary since the lower limit boundary value for 1-bit code and the corresponding code number are both zero); comparators 1212–1218 for comparing the code number entered from the terminal 1201 respectively with the code numbers output from the registers 1202–1208; and a priority encoder 1220 for receiving the outputs from the comparators 1212–1218 and identifying the code length of the Huffman code corresponding to the code number entered from the terminal 1201. The priority encoder 1220 sends the code length information n to a terminal 1246, a 1st selector 1221, a 2nd selector 1223 and a shifter 1242.

The 1st selector 1221 selects, according to the code length information, one of the code numbers supplied from the registers 1202–1208, for supply to the (−)-input terminal of a subtractor 1241, of which the (+)-input terminal receives the code number entered from the terminal 1201, whereby the subtractor 1241 effects a calculation of (input code number)–(code number corresponding to the lower limit boundary value for n-bit codes). The result of the subtraction is supplied to the shifter 1242 for a bit shift operation equivalent to the multiplication of $2^{8-n}$, and is sent to the adder 1243. On the other hand, the lower limit boundary values for 2- to 8-bit codes, retained in the registers 1232–1238, are supplied to the 2nd selector 1223.

The 2nd selector 1223 selects, as in the 1st selector 1221, a lower limit boundary value corresponding to n-bit codes, based on the code length information n supplied from the priority encoder 1220 and sends said boundary value to the adder 1243.

The adder 1243 adds the two input values to obtain a result corresponding to the equation (2), the result being supplied, as a Huffman code, to a terminal 1245. As already explained, the signal output from the terminal 1245 has 8 bits, on which upper n bits constitute an encoded Huffman code.

Figure 25:
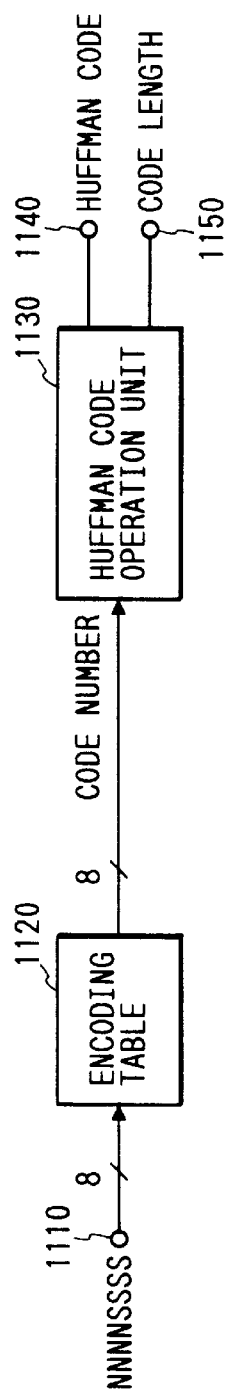
FIG. 25 is a view showing Huffman encoding process for the JPEG codes according to the present invention.

With the block shown in FIGS. 24A and 24B, for determining the Huffman code from the code number, the Huffman encoding of JPEG codes can be achieved with a configuration as shown in FIG. 25, so that the memory capacity required from the encoding table can be limited to 256 bytes.

The conversions achieved in said encoding table are inverse to those conducted in the decoding table of 256 bytes employed in the aforementioned decoding devices.

In FIGS. 24A and 24B, the output of the priority encoder 1220 is used as the selection control signal for the selectors 1221, 1223, but it is also possible to detect continuous "01" outputs from the outputs of plural comparators, as in the calculation of the code number and the code length shown in FIGS. 16A and 16B, and to use such output signals for the selector control signal.

Figure 26C:
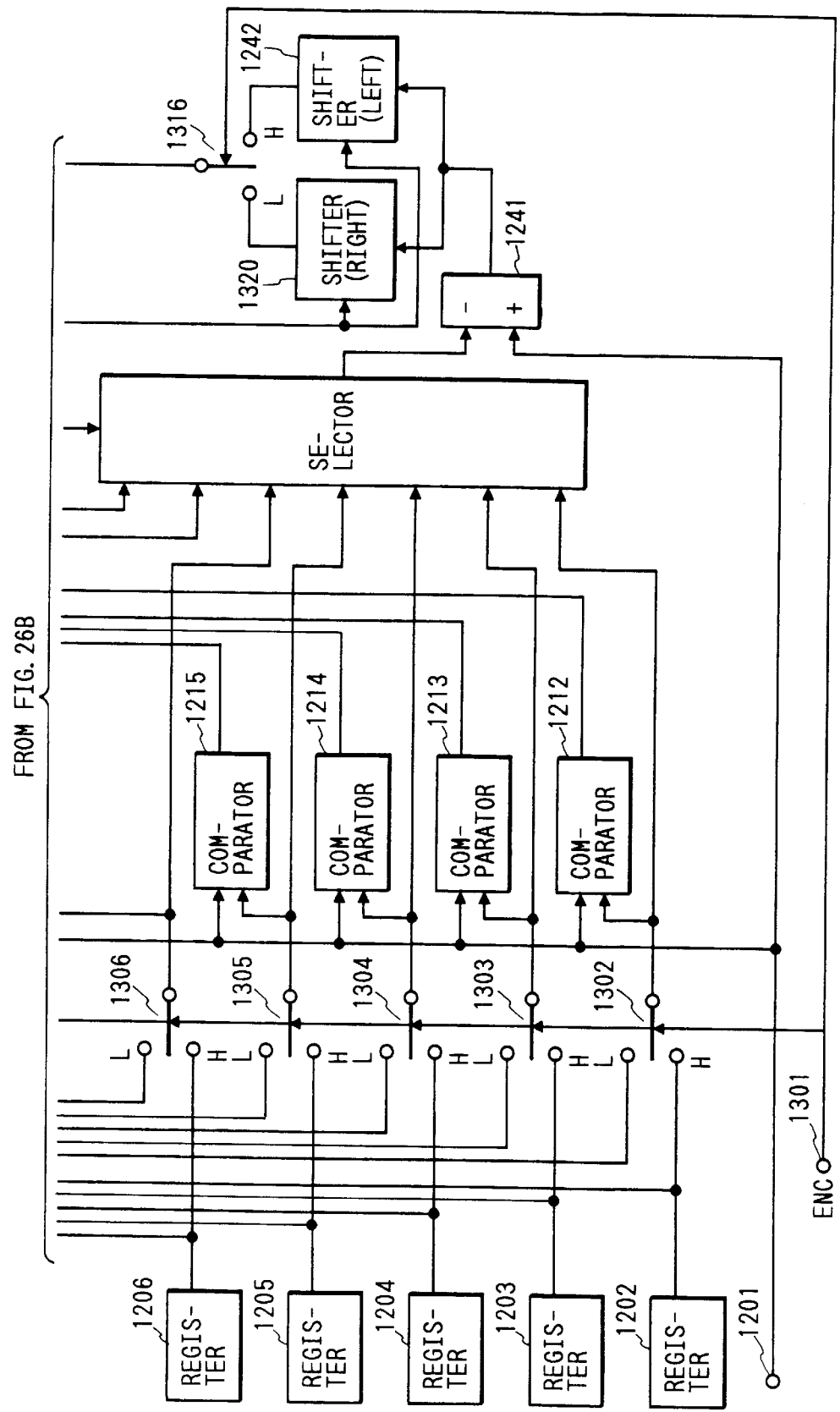

A 14th embodiment of the present invention is shown in FIGS. 26A to 26C.

The Huffman code calculating block in the encoding device shown in FIGS. 24A and 24B and the code number/code length calculating block in the decoding device shown in FIGS. 16A and 16B are different, as already explained in the foregoing, only in the method of generation of the selection control signals for the two selectors, but are almost same in the components of the hardware. Consequently there can be provided a circuit capable of the two calculations mentioned above, by the addition of some circuits to the Huffman code calculating circuit shown in FIGS. 24A and 24B.

In the following there will be listed the differences, other than the selector control signals mentioned above, between the Huffman code calculating block shown in FIGS. 24A and 24B and the code number/code length calculating block shown in FIGS. 16A and 16B:

(1) Registers for retaining the lower limit boundary values for different code lengths are replaced by registers for retaining the code numbers corresponding to the lower limit boundary values for different code length; and (2) The direction of bit shift on the output from the subtractor is mutually opposite (shift to the left in the encoding and shift to the right in the decoding).

FIGS. 26A to 26C show a modification of the Huffman code calculating block shown in FIGS. 24A and 24B, based on the above-mentioned differences. In FIGS. 26A to 26C, a terminal 1301 receives a signal ENC indicating an encoding mode (signal "1") or a decoding mode.

There are also provided 2-input 1-output selectors 1302–1316 switched by the mode signal ENC; and a shifter 1320 for a shift to the right, added for the decoding mode.

Other circuit blocks are same as those of corresponding numbers in FIGS. 24A and 24B.

The operational block of the present embodiment functions as a Huffman code calculating block in the encoding operation, in case of ENC="1", and as a code number/code length calculating block in the decoding operation, in case of ENC="0".

Figure 27B:
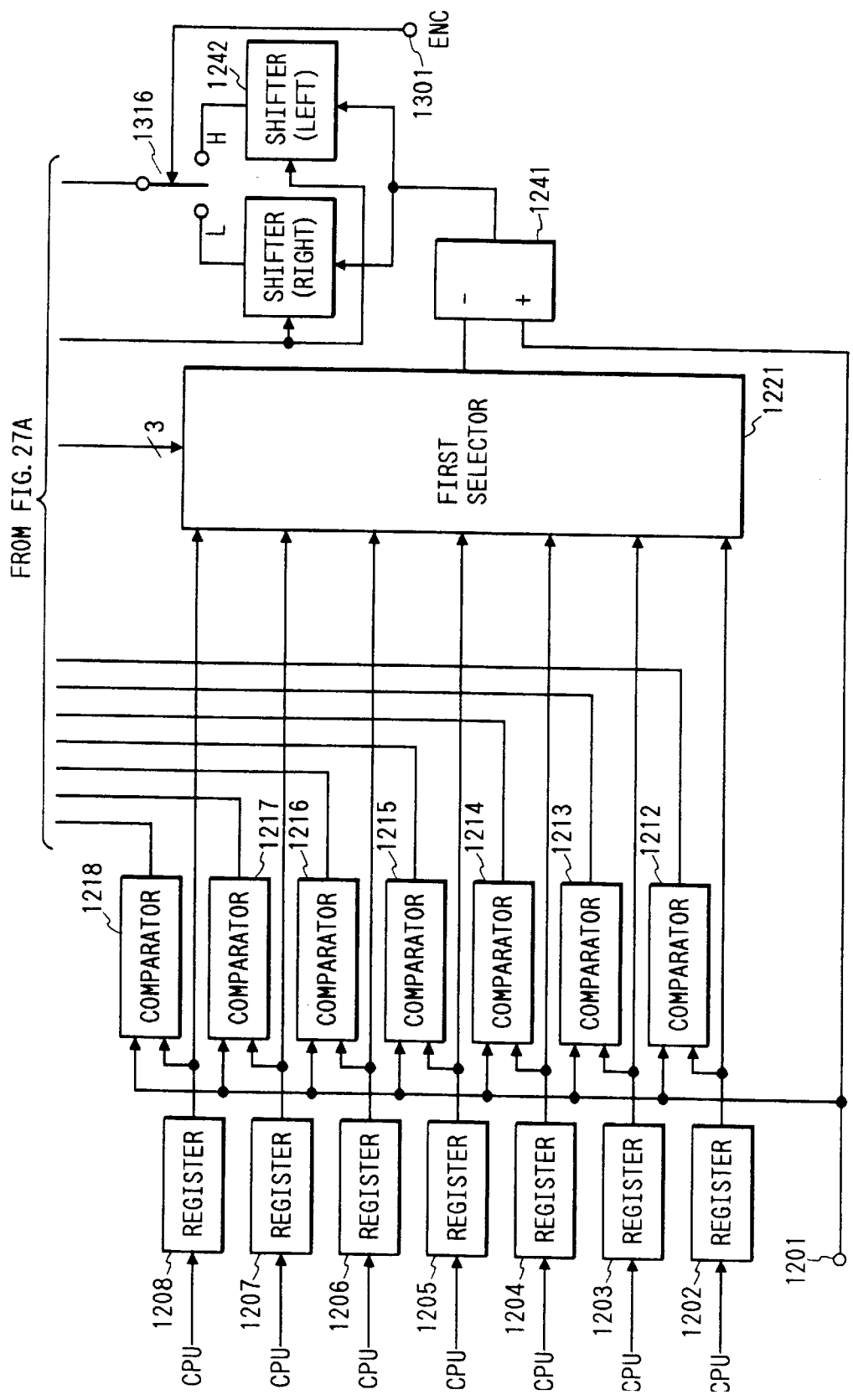

A 15th embodiment of the present invention is shown in FIGS. 27A and 27B.

The foregoing 14th embodiment employs 14 selectors 1302–1315 for switching the lower limit boundary values for different code lengths and the code numbers corresponding to the lower limit boundary values, but the 14 selectors can be dispensed with if the contents retained in the registers 1202–1208, 1232–1238 can be varied according to the encoding or decoding mode. Such variation can be realized in the circuit shown in FIGS. 27A and 27B, in which the contents of the registers 1202–1208, 1232–1238, such as the lower limit boundary values and the code numbers mentioned above, can be varied, for example by a CPU, according to the decoding or encoding mode.

Figure 28:
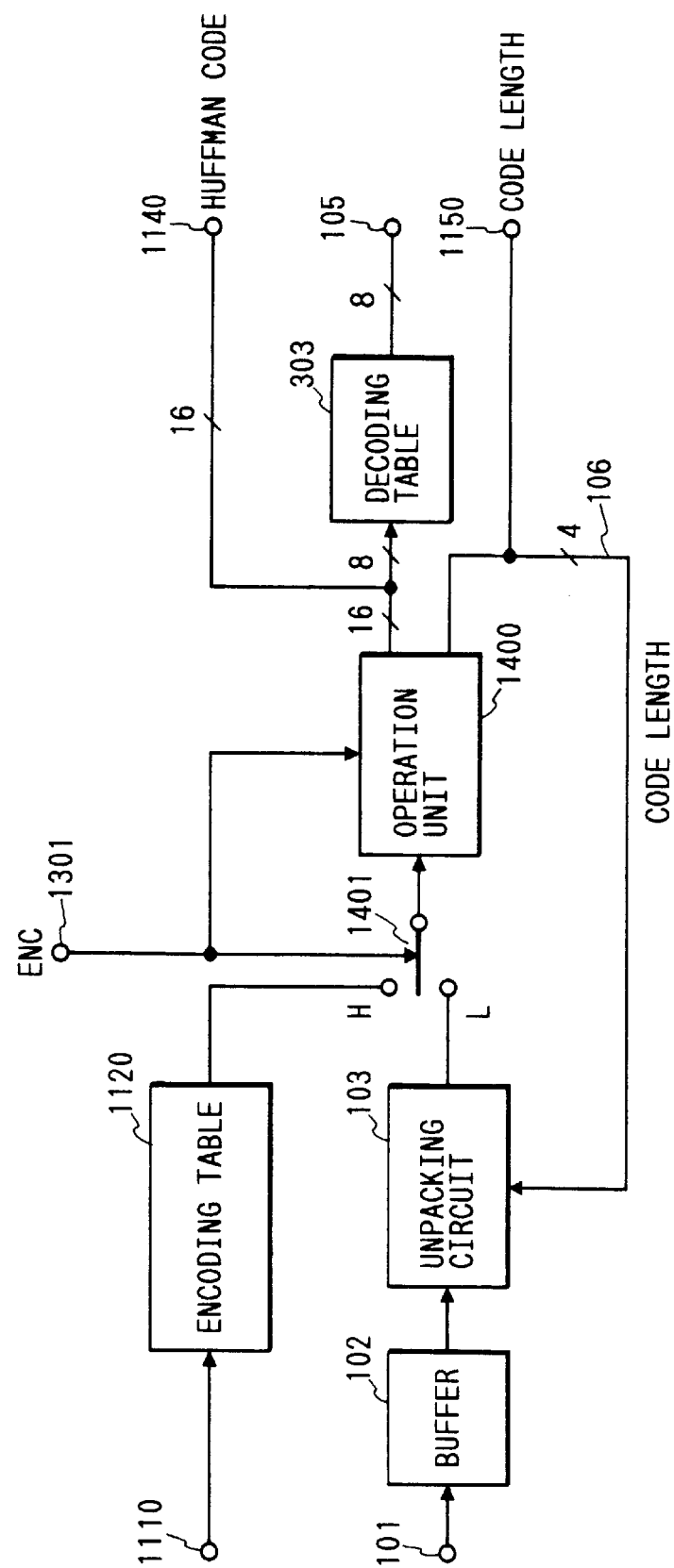
FIG. 28 is a circuit diagram of a sixteenth embodiment of the present invention.

A 16th embodiment of the present invention is shown in FIG. 28. According to the foregoing 14th or 15th embodiment, an operational circuit block can be used for encoding and also for decoding. The configuration shown in FIG. 28 including such operational unit 1400 can therefore function as a Huffman encoding device or a Huffman decoding device respectively when the ENC signal entered from a terminal 1301 is "1" (high) or "0" (low).

When the ENC signal is "1", a fixed-length code to be encoded is entered from a terminal 1110 and is converted into a code number by an encoding table 1120. The code number is selected by a selector 1401 and supplied to the operation unit 1400 which is so set as to function as a Huffman code calculating circuit by the entry of the above-mentioned ENC signal, whereby the Huffman code and the code length are respectively supplied to terminals 1140, 1150.

On the other hand, when the ENC signal is "0", a Huffman code is entered from the terminal 101 and guided through a buffer 102, an unpacking circuit 103 and a selector 1401, and leading bits, for example 16 bits, after the removal of the decoded data are sent to the operational unit 1400, which is so set as to function as a code number/code length calculating circuit by the entry of the above-mentioned ENC signal, whereby the code number and the code lengths are respectively supplied to the decoding table 303 and the unpacking circuit 103. The decoding table 303 converts the entered code number into the fixed-length code before encoding and sends the code to a terminal 105.

Figure 29:
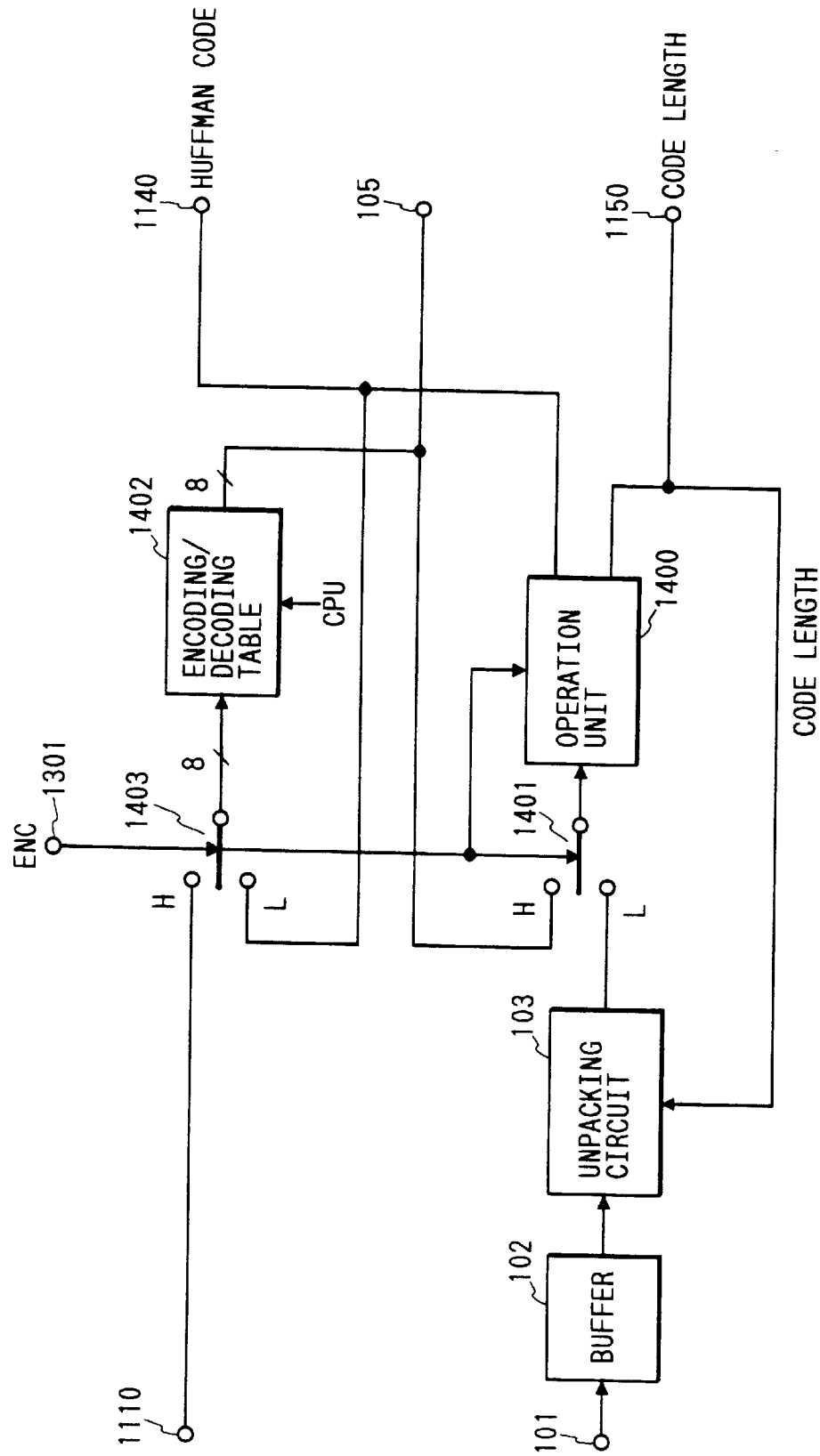
FIG. 29 is a circuit diagram of a seventeenth embodiment of the present invention.

A 17th embodiment of the present invention is shown in FIG. 29.

In the foregoing 16th embodiment (FIG. 28), the conversions conducted in the encoding table 1120 and those conducted in the decoding table 303 are mutually inverse. More specifically, the encoding table 1120 converts the fixed-length code prior to encoding into a code number, while the decoding table 303 converts the code number into a fixed-length code prior to encoding. As the above-mentioned two conversions, being basically a conversion from a fixed-length code to a fixed-length code, the number of bits of the input data is same as that of the output data, and the two tables mentioned above have a same memory capacity. Consequently these two tables can be united, as shown in FIG. 29, into a table 1402 rewritable for example by the CPU.

An encoding table or a decoding table is loaded in the table 1402, respectively when the ENC signal is "1" or "0".

Thus the present embodiment, shown in FIG. 29, can effect desired processes in the encoding and decoding operations, by means of said table 1402.

When the ENC signal is "1", a fixed-length code prior to encoding is entered from a terminal 1110, then selected by a selector 1403 and supplied to the table 1402, which converts the fixed-length code into a code number for supply to the operation unit 1400 through a selector 1401. The operation unit 1400 functions in the same manner as in the foregoing 16th embodiment. Consequently, from the entered code number, the operation unit 1400 calculates the Huffman code and the code length, which are respectively supplied to terminals 1140, 1150.

When the ENC signal is "0", a Huffman code is entered from the terminal 101, and guided through the buffer 102, unpacking circuit 103 and selector 1401, and the leading bits of the data to be decoded are supplied to the operation unit 1400. Based on said input data, the operation unit 1400 calculates the code number and the code length, which are respectively supplied to the unpacking circuit 103, and to the table 1402 through the selector 1403. The table 1402 converts the code number into the fixed-length code prior to encoding and sends the code to the terminal 105.

The embodiments explained in the foregoing can significantly reduce the memory capacity required for the decoding table in the decoding operation of Huffman codes, by determining the code number and the code length from the Huffman code by calculation, and converting the code number into the fixed-length code prior to Huffman encoding by means of the table. It is thus rendered possible to reduce the cost of the Huffman decoding device.

Also the Huffman encoding conducted by converting the fixed-length code prior to encoding into the code number by a table and determining the code length and the Huffman code by calculation from said code number becomes similar to the decoding process explained above. It is thus made possible to use the operation circuit and the conversion table for both the encoding and the decoding, and there can thus be provided an inexpensive Huffman encoding/decoding device.

What is claimed is:

1. An encoding and decoding device, comprising:
   (a) a first inputter, arranged for inputting a first code number corresponding to a first fixed-length code;
   (b) a first code length calculator, arranged for calculating a code length of a first variable length code corresponding to the first fixed-length code, by using results of comparing the inputted first code number with first reference values corresponding to code lengths;
   (c) a variable-length code calculator, arranged for calculating the first variable-length code corresponding to the first fixed-length code, by using the inputted first code number and one first reference value corresponding to the calculated code length;
   (d) a second inputter, arranged for inputting a second variable-length code;
   (e) a second code length calculator, arranged for calculating a code length of the inputted second variable-length code, by using results of comparing the inputted second variable-length code with second reference values corresponding to code lengths; and
   (f) a code number calculator, arranged for calculating a second code number which is used to convert the inputted second variable-length code into a second fixed-length code, by using the inputted second variable-leg code and one second reference value corresponding to the calculated code length.

2. A device according to claim 1, wherein a portion of the code number calculator is in common with a portion of the variable-length code calculator.

3. A device according to claim 1, wherein a portion of the second code length calculator is in common with a portion of the first code length calculator.

4. A device according to claim 1, wherein the inputted first code number represents an order of the variable-length codes.

5. A device according to claim 1, wherein the first fixed-length code and the second fixed-length code conform to JPEG standards.

6. A device according to claim 1, wherein the first fixed-length code includes first information representing a length of first additional information corresponding to the calculated first variable-length code, and the second fixed-length code includes second information representing a length of second additional information corresponding to the inputted second variable-length code.

7. A device according to claim 6, wherein the first fixed-length code, the first additional information, the second fixed-length code, and the second additional information conform to JPEG standards.

8. An encoding device, comprising:
   (a) an inputter, arranged for inputting a code number corresponding to a fixed-length code;
   (b) a code length calculator, arranged for calculating a code length of a variable-length code corresponding to the fixed-length code, by using results of comparing the inputted code number with reference values corresponding to code lengths; and
   (c) a variable-length code calculator, arranged for calculating the variable-length code corresponding to the fixed-length-code, by using the inputted code number and one reference value corresponding to the calculated code length.

9. A device according to claim 8, wherein the inputted code number represents an order of the variable-length codes.

10. A device according to claim 8, wherein the fixed-length code conforms to JPEG standards.

11. A device according to claim 8, wherein the fixed-length code includes information representing a length of additional information corresponding to the calculated variable-length code.

12. A device according to claim 11, wherein the fixed-length code and the additional information conform to JPEG standards.

13. A decoding device, comprising:
   (a) an inputter, arranged for inputting a variable-length code;
   (b) a code length calculator, arranged for calculating a code length of the inputted variable-length code, by using results of comparing the inputted variable-length code to reference values corresponding to code lengths; and
   (c) a code number calculator, arranged for calculating a code number, which is used to convert the inputted variable-length code into a fixed-length code, by using the inputted variable-length code and one reference value corresponding to the calculated code length.

14. A device according to claim 13, wherein the inputted code number represents an order of the variable-length codes.

15. A device according to claim 13, wherein the fixed length code conforms to JPEG standards.

16. A device according to claim 13, wherein the fixed-length code includes information representing a length of additional information corresponding to the inputted variable-length code.

17. A device according to claim 16, wherein the fixed-length code and the additional information conform to JPEG standards.

18. An encoding method, comprising the steps of:
(a) inputting a code number corresponding to a fixed-length code;
(b) calculating a code length of a variable-length code corresponding to the fixed-length code, by using results of comparing the inputted code number with reference values corresponding to code lengths; and
(c) calculating the variable-length code corresponding to the fixed-length length code, by using the inputted code number and one reference value corresponding to the calculated code length.

19. A method according to claim 18, wherein the inputted code number represents an order of the variable-length codes.

20. A method according to claim 18, wherein the fixed-length code conforms to JPEG standards.

21. A method according to claim 18, wherein the fixed-length code includes information representing a length of additional information corresponding to the calculated variable-length code.

22. A method according to claim 21, wherein the fixed-length code and the additional information conform to JPEG standards.

23. A decoding method, comprising the steps of:
(a) inputting a variable-length code;
(b) calculating a code length of the inputted variable-length code, by using results of comparing the inputted variable-length code to reference values corresponding to code lengths; and
(c) calculating a code number, which is used to convert the inputted variable-length code into a fixed-length code, by using the inputted variable-length code and one reference value corresponding to the calculated code length.

24. A method according to claim 23, wherein the inputted code number represents an order of the variable-length codes.

25. A method according to claim 23, wherein the fixed-length code conforms to JPEG standards.

26. A method according to claim 23, wherein the fixed-length code includes information representing a length of additional information corresponding to the inputted variable-length code.

27. A method according to claim 26, wherein the fixed-length code and the additional information conform to JPEG standards.

* * * * *

UNITED STATES PATENT AND TRADEMARK OFFICE
CERTIFICATE OF CORRECTION

PATENT NO. : 6,408,102 B1
DATED : June 18, 2002
INVENTOR(S) : Tadayoshi Nakayama It is certified that error appears in the above-identified patent and that said Letters Patent is hereby corrected as shown below:

<u>Title page,</u>
Item [*], Notice, insert
-- This patent issued on a continued prosecution application filed under 37 CFR 1.53(d), and is subject to the twenty year patent term provisions of 35 U.S.C. 1.54(a)(2). --.
Item [57], ABSTRACT,
Line 3, "decode," should read -- decoded, --.

<u>Column 1,</u>
Line 15, "progresses" should read -- progress --.

<u>Column 3,</u>
Line 41, "view" shouldread -- view showing --.

<u>Column 13,</u>
Line 24, "are" should read -- is --.

<u>Column 14,</u>
Line 22, "process same" should read -- process the same --; and
Line 56, "Huffman" should read -- Huffman code --.

Signed and Sealed this

Twenty-third Day of March, 2004

JON W. DUDAS
*Acting Director of the United States Patent and Trademark Office*